(12) United States Patent
Kawasoe et al.

(10) Patent No.: US 9,121,876 B2
(45) Date of Patent: Sep. 1, 2015

(54) GENERATED POWER OUTPUT MEASURING APPARATUS

(71) Applicant: Togami Electric Mfg. Co., Ltd., Saga-shi, Saga (JP)

(72) Inventors: Yoshiyuki Kawasoe, Saga (JP); Takeshi Katafuchi, Saga (JP); Masayuki Koba, Saga (JP)

(73) Assignee: Togami Electric Mfg. Co., Ltd., Saga (JP)

( * ) Notice: Subject to any disclaimer, the term of this patent is extended or adjusted under 35 U.S.C. 154(b) by 99 days.

(21) Appl. No.: 13/853,175

(22) Filed: Mar. 29, 2013

(65) Prior Publication Data

US 2014/0125376 A1 May 8, 2014

(30) Foreign Application Priority Data

Apr. 5, 2012 (JP) ................................. 2012-086833

(51) Int. Cl.
*G01R 21/06* (2006.01)
*G01R 21/133* (2006.01)

(52) U.S. Cl.
CPC .............. *G01R 21/133* (2013.01); *G01R 21/06* (2013.01)

(58) Field of Classification Search
CPC .. G01R 21/06; G01R 21/133; G01R 31/2605; G01R 31/405; H01L 31/02021; H01L 31/042
USPC ................. 324/764.01, 140 R, 434, 440, 501, 324/761.01; 702/60; 136/244
See application file for complete search history.

(56) References Cited

U.S. PATENT DOCUMENTS

| 5,669,987 | A | 9/1997 | Takehara et al. |
| 5,869,956 | A * | 2/1999 | Nagao et al. .................. 323/299 |
| 7,667,610 | B2 * | 2/2010 | Thompson .................... 340/657 |
| 8,908,404 | B2 * | 12/2014 | Itako .............................. 363/95 |
| 2010/0282289 | A1 * | 11/2010 | Wu et al. ........................ 136/244 |
| 2011/0241719 | A1 * | 10/2011 | Shr et al. .................. 324/761.01 |
| 2011/0297204 | A1 * | 12/2011 | Gibson et al. ................. 136/244 |
| 2011/0316578 | A1 * | 12/2011 | Mizutani et al. ......... 324/761.01 |
| 2012/0047386 | A1 * | 2/2012 | Matsui .......................... 713/340 |
| 2012/0242320 | A1 | 9/2012 | Fischer et al. |
| 2013/0016536 | A1 * | 1/2013 | Ehlmann et al. ................ 363/34 |
| 2013/0018607 | A1 * | 1/2013 | Jin et al. .......................... 702/60 |
| 2013/0285670 | A1 * | 10/2013 | Yoshidomi et al. ........... 324/510 |

FOREIGN PATENT DOCUMENTS

JP 08-185235 7/1996

* cited by examiner

*Primary Examiner* — Huy Q Phan
*Assistant Examiner* — David Frederiksen
(74) *Attorney, Agent, or Firm* — Rankin, Hill & Clark LLP

(57) ABSTRACT

A generated power output measuring apparatus includes a load unit connected to a connecting wire between a power generator using natural energy and a power conditioner configured to supply electric power of the power generator to an external load, the load unit being configured to draw a current from the power generator, a measuring unit configured to measure a voltage and current of the power generator via the load unit, and a control unit configured to increase the current flowing through the load unit and cause the measuring unit to make a measurement when the voltage measured by the measuring unit is in a range of operating voltage of the power conditioner.

10 Claims, 22 Drawing Sheets

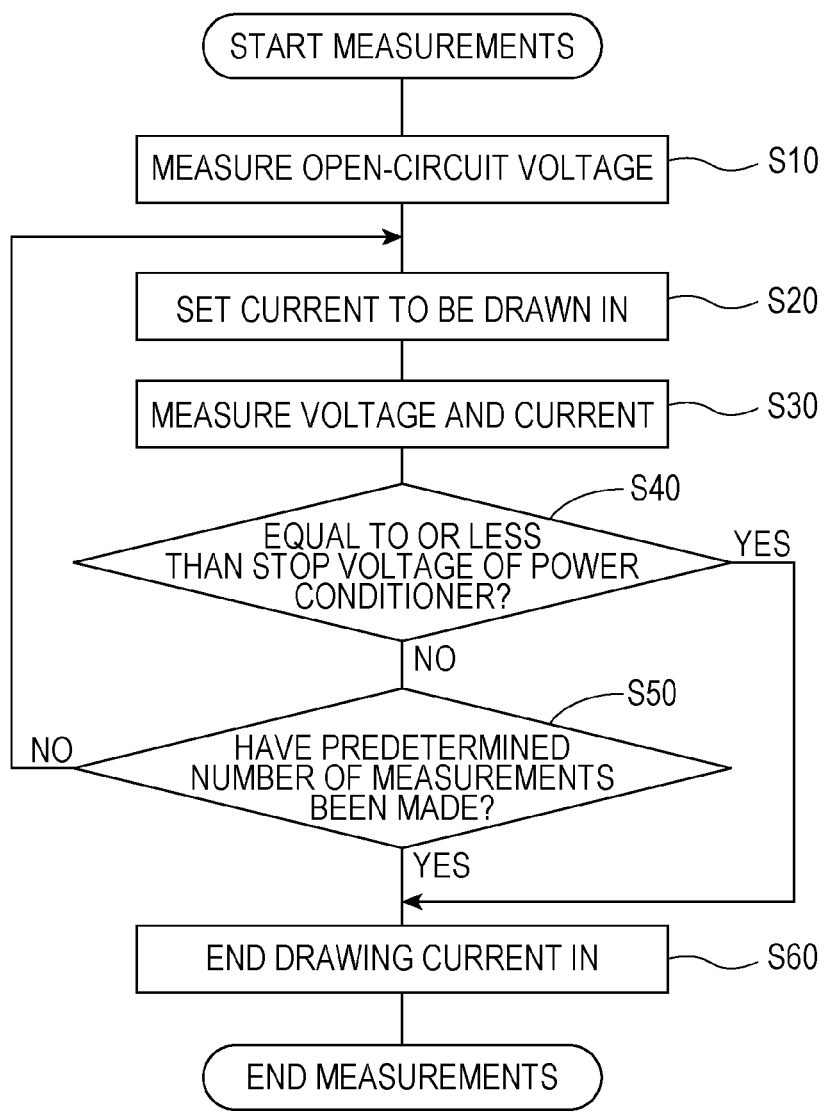

ural energy.

GENERATED POWER OUTPUT MEASURING APPARATUS

CROSS-REFERENCE TO RELATED APPLICATION

This application is based on Japanese Patent Applications No. 2012-086833 filed with the Japan Patent Office on Apr. 5, 2012, the entire contents of which are hereby incorporated by reference.

BACKGROUND

1. Technical Field

The embodiments disclosed herein relate to a generated power output measuring apparatus that measures output from a power generator using natural energy.

2. Related Art

A solar power generator, a wind power generator, and the like have been known as power generators using natural energies. The output values (output amounts) of voltages, currents, and the like output from these power generators vary according to the environment (e.g., the installation environment of the power generator). Moreover, these output values vary also due to contamination or aging of the power generator.

When such a power generator is maintained, the output value of the power generator, for example, is measured. A generated power output measuring apparatus is used for the measurement.

JP 08-185235 A discloses a known generated power output measuring apparatus that measures output of a power generator using natural energy.

A "linkage type solar light power generating device with abnormality checking function for solar battery module power generator" described in JP 08-185235 A includes a solar array. The solar array includes parallel-connected strings $S_1$ to $S_n$. Each of the strings $S_1$ to $S_n$ includes a plurality of solar modules connected in series. The apparatus compares output voltages $V_{S1}$ to $V_{Sn}$ of the strings $S_1$ to $S_n$ in the solar array with an input voltage $V_{in}$. Consequently, an abnormality of the string is detected and identified.

SUMMARY

A generated power output measuring apparatus includes a load unit connected to a connecting wire between a power generator using natural energy and a power conditioner configured to supply electric power of the power generator to an external load, the load unit being configured to draw a current from the power generator, a measuring unit configured to measure a voltage and current of the power generator via the load unit, and a control unit configured to increase the current flowing through the load unit and cause the measuring unit to make a measurement when the voltage measured by the measuring unit is in a range of operating voltage of the power conditioner.

BRIEF DESCRIPTION OF DRAWINGS

FIG. 4 is a flowchart illustrating the operation and usage state of the generated power output measuring apparatus illustrated in FIG. 2;

DETAILED DESCRIPTION

Figure 1:
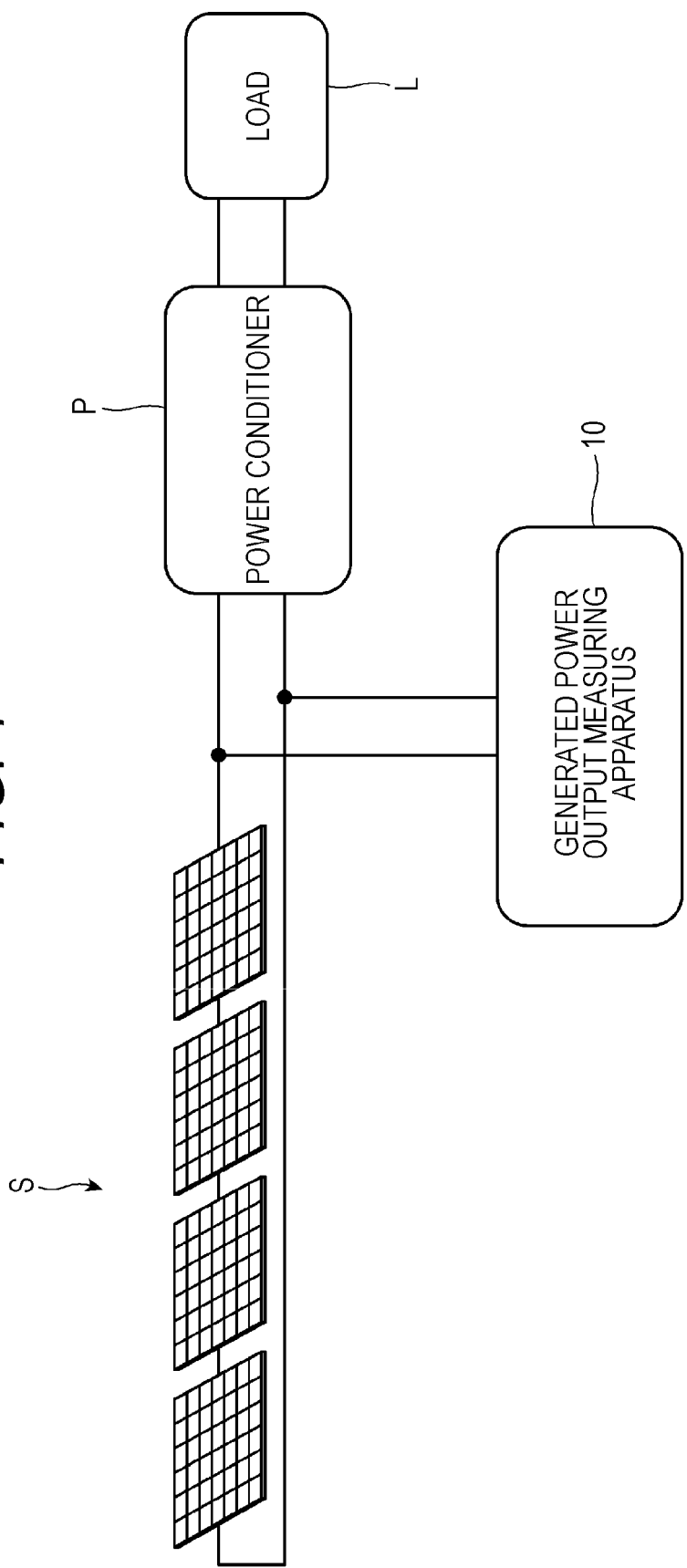
FIG. 1 is a diagram illustrating a generated power output measuring apparatus according to a first embodiment of the present disclosure, which is connected between a solar power generator and a power conditioner.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The power generator according to JP 08-185235 A measures the voltages of the strings without drawing a current in. Thus, only the output voltages of the strings at the time of measurement are measured. However, it is difficult to find an abnormality of the output voltage due to a change in load current simply by measuring the output voltage.

A measuring apparatus captures a current to find an abnormality of the output voltage due to a change in load current. However, a solar power generator or the like is not a constant-voltage power supply. Accordingly, when the measuring apparatus captures a current, the output voltage of the power generator suddenly drops. Thus, an input voltage of a power conditioner also drops. Consequently, the power conditioner may stop operating. Therefore, at the time of inspecting the power generator, the power generator and the power conditioner are disconnected to measure the voltage and the current.

A large-scale company in the electric power business supplies electric power generated by a power generator to a load and sells the remaining electric power. In this case, a stop of the power conditioner leads to loss in power generation. Accordingly, it is a great blow to the company. Therefore, a generated power output measuring apparatus that can inspect a power generator without stopping a power conditioner has been desired.

An object of the present disclosure is to provide a generated power output measuring apparatus that can measure the output of a power generator without stopping a power conditioner. In the apparatus, it becomes possible to suppress loss in power generation of the power generator.

(First Embodiment)

A generated power output measuring apparatus according to a first embodiment of the present disclosure will be described with reference to the drawings.

As illustrated in FIG. 1, a generated power output measuring apparatus 10 measures an output voltage of a solar power generator S. The solar power generator S is an example of a power generator using natural energy. The solar power generator S is connected to a power conditioner P.

The solar power generator S includes one string (power generating member) having a plurality of solar power generation panels connected in series. A predetermined voltage is output from the string. For example, if an input voltage of the power conditioner P is set to 200 V, the string includes ten serial-connected solar power generation panels with an output voltage of 20 V.

The power conditioner P supplies output from the solar power generator S as adjusted electric power to a load (external load) L. The power conditioner P has the following functions: The power conditioner P converts DC output power from the solar power generator S to AC power. Moreover, the power conditioner P uses maximum power point tracking (MPPT) to output to the load L the maximum electric power, which is output from the solar power generator S on a moment-to-moment basis in an ever-changing environment power generator.

Figure 2:
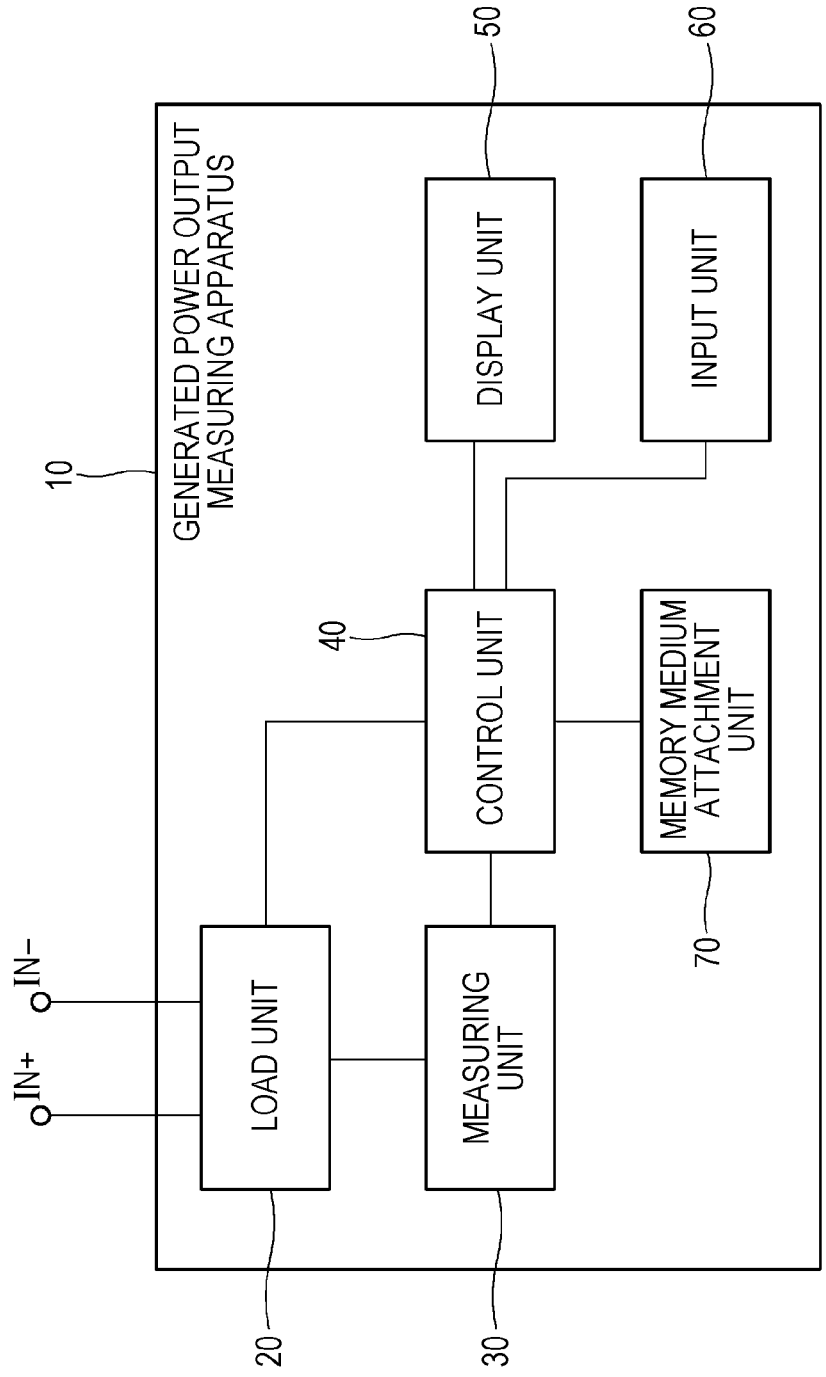
FIG. 2 is a diagram illustrating the configuration of the generated power output measuring apparatus illustrated in FIG. 1.

The generated power output measuring apparatus 10 is connected to an output terminal of the solar power generator S or an input terminal of the power conditioner P. The generated power output measuring apparatus 10 may be fixed to the output terminal of the solar power generator S or the input terminal of the power conditioner P. In this case, a full-time connection is provided. Alternatively, a connecting wire of the generated power output measuring apparatus 10 may be a probe. The probe may be connected only at the time of measurement (inspection). Moreover, there may be a connection terminal between the output terminal of the solar power generator S and the input terminal of the power conditioner P. At the time of measurement, the probe of the generated power output measuring apparatus 10 may be brought into contact with the connection terminal As illustrated in FIG. 2, the generated power output measuring apparatus 10 includes a load unit 20, a measuring unit 30, a control unit 40, a display unit 50, an input unit 60, and a memory medium attachment unit 70.

The load unit 20 includes a voltage dummy load and a current dummy load. The load unit 20 is connected to the connecting wire connecting between the solar power generator S and the power conditioner P. The load 20 draws (inputs) a current from the solar power generator S. The load unit 20 is used to measure the current and voltage of the solar power generator S. The load unit 20 may have a circuit configuration illustrated in FIG. 3, for example.

Figure 3:
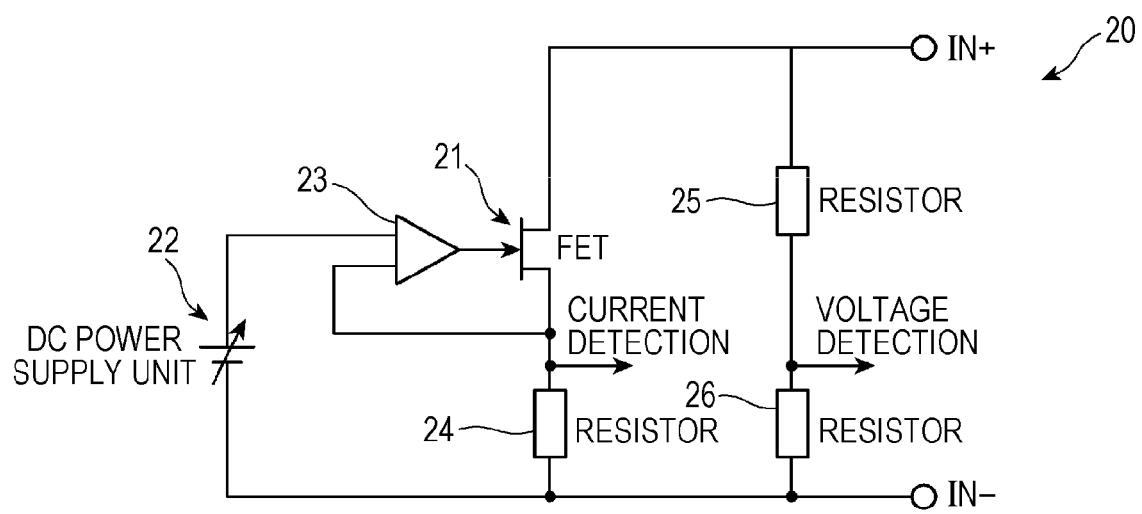
FIG. 3 is a diagram illustrating an example of a load unit in the generated power output measuring apparatus illustrated in FIG. 2.

FIG. 3 illustrates an example of the load unit 20. The load unit 20 includes an FET 21, a DC power supply unit 22, an OP amplifier 23, a resistor 24, a resistor 25, and a resistor 26. The FET 21 is a current dummy load. A current from a terminal IN+ is flowed into the FET 21 in accordance with the gate voltage. An output voltage of the DC power supply unit 22 is adjusted by the control unit 40. The OP amplifier 23 changes an output voltage from the DC power supply unit 22 into the gate voltage of the FET 21. A drain-source current in accordance with the gate voltage of the FET 21 flows through the resistor 24. The resistors 25 and 26 are voltage dummy loads. The resistors 25 and 26 are splitter resistors placed between the terminals IN+ and IN−.

A voltage across the resistor 26 is measured as a voltage between the terminals IN+ and IN−. The obtained voltage is set as the output voltage of the solar power generator S. Thus, the resistance value of the resistor 26 is desired to be sufficiently larger than that of the resistor 25.

The measuring unit 30 measures the voltage across the resistor 26. In other words, the measuring unit 30 measures the voltage and current of the solar power generator S via the load unit 20. The measuring unit 30 measures a current flowing through the resistor 24 based on a voltage across the resistor 24. The measuring unit 30 has a function of notifying the control unit 40 of the measured voltage and current. The measuring unit 30 can include, for example, an AD converter connected to both ends of the resistor 26, an AD converter connected to both ends of the resistor 24, and a divider. The divider calculates the current by dividing the voltage measured by the AD converter by the resistance value of the resistor 24. In the embodiment, the function of the divider in the measuring unit 30 is included in the control unit 40.

The control unit 40 adjusts the output voltage of the DC power supply unit 22. Thus, the control unit 40 controls the current flowing into the load unit 20. The control unit 40 displays the voltage and current measured by the measuring unit 30 on the display unit 50.

The control unit 40 can include a CPU that performs an operation and control, a ROM provided as a nonvolatile memory serving as a storage unit, and a RAM provided as a nonvolatile memory. The ROM stores a set value input from the input unit 60 and/or a generated power output measurement program. The ROM may be a rewritable nonvolatile memory (e.g., flash memory). The generated power output measurement program stored in the ROM is executed by the CPU. Thus, the CPU, the ROM, the RAM, and the like function as the control unit 40.

The set values set by the control unit 40 include a lower operating value of the power conditioner P, the number of strings of the solar power generator S, and a threshold value for detecting a failure of the solar power generator S. In the first embodiment, the set values include a stop voltage of the power conditioner P (100 V) and the number of strings (1).

The display unit 50 displays display data transmitted from the control unit 40. The display unit 50 can include an LCD panel or organic EL panel. A user (measurer) can input various settings, and an operation instruction to the control unit 40 via the input unit 60. In the embodiment, the input unit 60 may be a touchscreen. The input unit 60 may be a keyboard or a switch group where dedicated keys are arranged, apart from the touchscreen.

A memory medium is attached to the memory medium attachment unit 70. The memory medium attachment unit 70 is an interface for writing to the memory medium the voltage or current measured by the generated power output measuring apparatus 10, a graph, or other measurement conditions. The memory medium may be a USB memory, or a memory card including a nonvolatile memory. The memory card may be, for example, an SD card, a compact flash (registered trademark), or a memory stick (registered trademark).

The operation and usage state of the generated power output measuring apparatus 10 according to the first embodiment of the present disclosure, which is configured as described above, will be described with reference to the drawings.

First, as illustrated in FIG. 4, the control unit 40 measures an interconnected string voltage $V_{ST}$ (Step S10). The interconnected string voltage $V_{ST}$ in the generated power output measuring apparatus 10 is a voltage between the terminal IN+ and the terminal IN− (the inter-terminal voltage) in a state where the power conditioner P supplies the maximum electric power to the load L and in a state where current does not flow through the FET 21 illustrated in FIG. 3. The control unit 40 causes the measuring unit 30 to read in the voltage across the resistor 26. Consequently, the interconnected string voltage $V_{ST}$ can be obtained.

Next, the control unit 40 sets a current drawn into the load unit 20 by adjusting the output voltage of the DC power supply unit 22 of the load unit 20 (Step S20). The DC power supply unit 22 outputs the voltage, which has been adjusted by the control unit 40, to the gate of the FET 21 via the OP amplifier 23. The FET 21 flows a current in accordance with the gate voltage from the terminal IN+ to the terminal IN− as the drain-source current.

The voltage across the resistor 24 is generated by the current flowing through the resistor 24. The measuring unit 30 divides the voltage across the resistor 24 by the resistance value of the resistor 24. The current is thus calculated. The control unit 40 reads in the current calculated by the measuring unit 30. Moreover, the control unit 40 reads in the measured voltage across the resistor 26. The control unit 40 stores the voltage and current obtained by the measuring unit 30 in a storage unit of the control unit 40.

The control unit 40 judges whether or not the voltage measured by the measuring unit 30 is within a range of the operating voltage of the power conditioner P (a voltage range where the power conditioner P can operate). Thus, the control unit 40 determines whether or not the voltage measured by the measuring unit 30 is equal to or less than the stop voltage of the power conditioner P (Step S40).

A current being drawn into the load unit 20 causes a decrease in the output voltage of the solar power generator S (that is, the input voltage to the power conditioner P). If it causes the power conditioner P to stop, the supply of electric power to the load L and the selling of electric power can be affected. In order to suppress this, it is considered to provide the range of the operating voltage of the power conditioner P to be larger than the stop voltage of the power conditioner P. In other words, it is considered that the measuring unit 30 measures the voltage such that the input voltage into the power conditioner P does not fall below the stop voltage of the power conditioner P.

However, for example, suppose the input voltage into the power conditioner P (the voltage to be measured) falls below the stop voltage (100V) that is a lower limit of the range of the operating voltage of the power conditioner P. If a period of time during which the voltage falls below the stop voltage (measurement time, or a period of time during which current flows into the load unit 20) is short, the power conditioner P operates normally. In other words, the measurement time can be made shorter than the time between when the input voltage into the power conditioner P falls to or below the stop voltage and when the power conditioner P stops (first time). Consequently, the power conditioner P can be prevented from being stopped due to the measurement.

In the generated power output measuring apparatus 10 according to the first embodiment, the control unit 40 executes one step of increasing the current (one measurement of the voltage and current) for approximately 20 to 30 µS. In other words, a period of time during which current flows through the load unit 20 is approximately 20 to 30 µS. This time is shorter than the first time. Therefore, even if the input voltage into the power conditioner P falls to or below the stop voltage due to the measurement, the power conditioner P can be prevented from being stopped.

Therefore, even if the input voltage into the power conditioner P falls to or below the stop voltage of the power conditioner P due to the measurement by the measuring unit 30, the power conditioner P continues operating. In this manner, the lower limit of the range of the operating voltage of the power conditioner P can be set to the stop voltage, or lower, of the power conditioner P, by shortening the measurement time by the measuring unit 30.

In the first embodiment, the measurement ends when the input voltage into the power conditioner P (the measured voltage) falls to or below the stop voltage of the power conditioner P (Step S40). However, there is a power conditioner that can operate normally as long as the measurement time is short even if the input voltage into the power conditioner P falls to 0 V due to the measurement. In this case, the lower limit of the range of the operating voltage of the power conditioner P can be set to 0 V. The setting of the stop voltage to 0 V via the input unit 60 allows the measurement to be continued until the voltage measured by the measuring unit 30 falls to 0 V. In other words, a short-circuit current $I_{SC}$ can be measured. The short-circuit current $I_{SC}$ is a current that the solar power generator S can flow when the output of the solar power generator S is short-circuited.

In this manner, shortening of the measurement time can expand a range of an increase in a current drawn in the load unit 20.

In Step S40, if it is determined that the measured voltage is equal to or less than the stop voltage of the power conditioner P, the control unit 40 concludes that the measured voltage is the stop voltage. The control unit 40 then ends the measurement. If the measured voltage is not equal to or less than the stop voltage, the control unit 40 moves to Step S50.

Next, the control unit 40 determines whether or not the voltage has been measured by the measuring unit 30 a predetermined number of times (Step S50). In the embodiment, a current up to 10 A can be flown through the resistor 24 of the load unit 20. The control unit 40 adjusts the voltage value of the DC power supply unit 22 so as to increase the current flowing through the resistor 24 stepwise by 0.1 A. In Step S50, therefore, the control unit 40 determines whether or not the voltage has been measured 100 times.

In Step S50, if it is determined that the number of measurements of the voltage is less than the predetermined number, the control unit 40 returns to Step S20. The control unit 40 adjusts the voltage value of the DC power supply unit 22 of the load unit 20 such that the increased current flows through the load unit 20. In Step S50, if it is determined that the voltage has been measured the predetermined number of times, the control unit 40 instructs the DC power supply unit 22 of the load unit 20 to stop voltage output (adjusts the output voltage value of the DC power supply unit 22 to 0). The control unit 40 then ends the flowing of current into the load unit 20 and ends the measurement (Step S60).

In this manner, Steps S20 to S50 are repeated. Consequently, the current flown into the load unit 20 has a waveform that gradually increases from 0 A as illustrated in FIG. 5A.

Figure 5A:
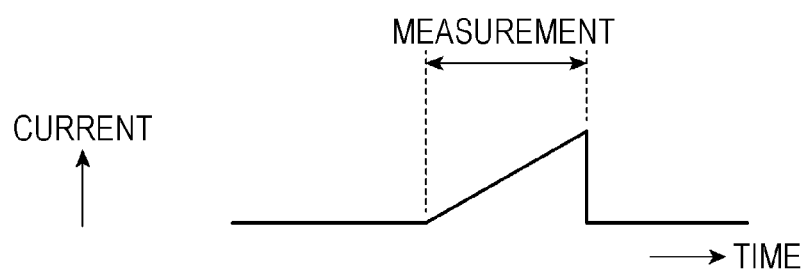
FIG. 5A is a waveform chart of a current flown into the load unit of the generated power output measuring apparatus illustrated in FIG. 2.
Figure 5B:
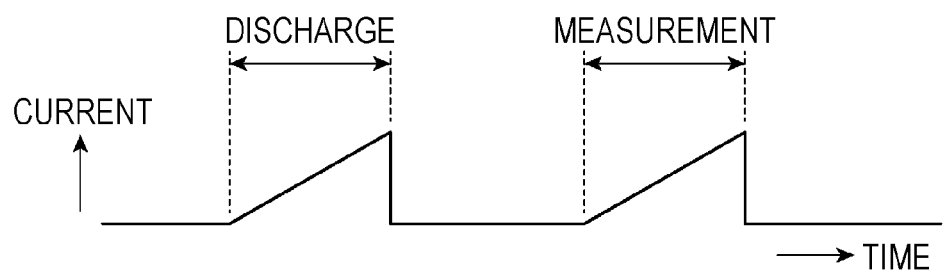
FIG. 5B is a waveform chart of a current flown into the load unit of the generated power output measuring apparatus illustrated in FIG. 2.

In the example illustrated in FIG. 5A, current is flown into the load unit 20 one time in one measurement. However, current may be flown in as illustrated in FIG. 5B. In the example illustrated in the drawing, firstly, current is flown into the load unit 20 one time. Electric charge accumulated in a capacity included in the solar power generation panel of the solar power generator S is discharged. Current is subsequently flown into the load unit 20 for the purpose of measurement. Consequently, measurement accuracy is increased.

Voltage data and current data are stored in the storage unit in the control unit 40. The control unit 40 displays a current-voltage characteristic graph (I-V characteristic graph) on the display unit 50 based on these data.

Figure 6A:
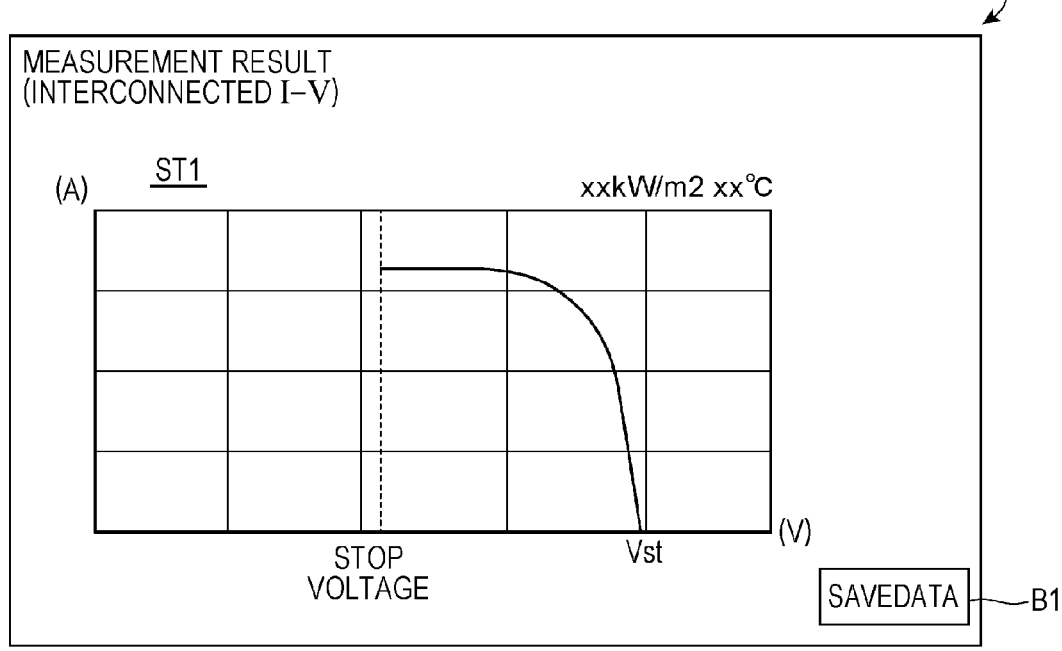
FIG. 6A is a current-voltage characteristic graph displayed on a display unit of the generated power output measuring apparatus illustrated in FIG. 2, and is a graph when a lower limit of the operating voltage of the power conditioner is set as a stop voltage.

As illustrated in FIG. 6A, in the display unit 50, current flown into the load unit 20 is increased from the obtained interconnected string voltage $V_{ST}$ point. The control unit 40 graphs and displays the current when the output voltage of the solar power generator S is reduced. Thus, a measurer can grasp the characteristic at a glance.

The measurer can process the data of the measured voltage and current on another personal computer. In this case, the measurer presses a "Save Data" button B1 displayed on the display unit 50. With the press, a notification that the "Save Data" button B1 has been pressed is sent from the input unit 60 being a touchscreen to the control unit 40. The control unit 40 then writes the data into the memory medium attached to the memory medium attachment unit (external memory attachment unit) 70. Consequently, the measurer can bring out the memory medium where the data are stored. Data to be written to the memory medium may be, for example, text format, text CSV format, or binary format data.

In this manner, the current from the solar power generator S is flown into the load unit 20. The control unit 40 increases the current to flow through the load unit 20 while the voltage measured by the measuring unit 30 is within the range of the operating voltage of the power conditioner P. Accordingly, the generated power output measuring unit 10 (the control unit 40) can measure an output value of the solar power generator S by the measuring unit 30 without stopping the power conditioner P. Therefore, the generated power output measuring apparatus 10 can suppress loss in power generation of the solar power generator S.

Figure 6B:
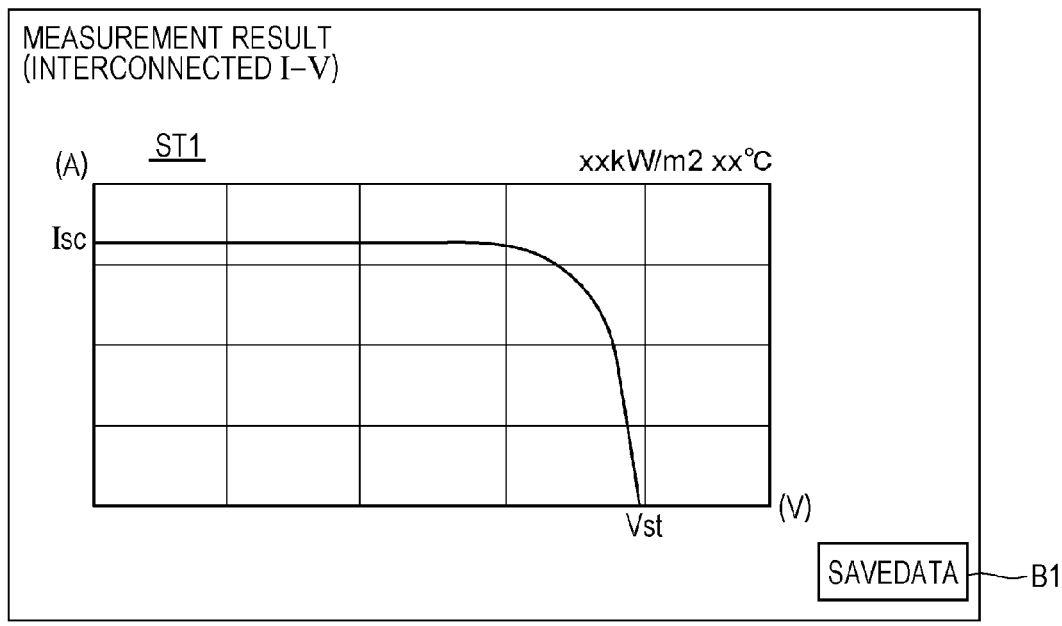
FIG. 6B is a diagram illustrating a current-voltage characteristic graph displayed on the display unit of the generated power output measuring apparatus illustrated in FIG. 2, and is a graph when the stop voltage is set to 0 V.

Moreover, the measurement time is short in the generated power output measuring apparatus 10. Furthermore, the current flown into the load unit 20 is increased until the short-circuit current $I_{SC}$ is measured. As illustrated in FIG. 6B, therefore, the generated power output measuring apparatus 10 can measure a wide range of current-voltage characteristics. Moreover, the measurement of the short-circuit current $I_{SC}$ makes it possible to readily check a change in characteristics in the event of a short circuit of the solar power generator S. For example, at a short-circuit current, an abnormality caused by deterioration of the characteristic of the solar power generation panel can be detected.

The control unit 40 compares the measured short-circuit current $I_{SC}$ with a threshold value of deterioration of the characteristic of the solar power generator S, which is set (stored) in the control unit 40. The control unit 40 can display on the display unit 50 messages such as that "the characteristic of the solar power generator is deteriorating" when the measured short-circuit current $I_{SC}$ is smaller than the threshold value. The control unit 40 may set a plurality of threshold values to have stepwise different values. In this case, the control unit 40 may display a different current level in accordance with a different threshold value as the short-circuit current $I_{SC}$ gradually becomes smaller. Consequently, the control unit 40 can display the degree of deterioration of the solar power generator S.

(Second Embodiment)

A description will be given of a generated power output measuring apparatus according to a second embodiment of the present disclosure with reference to the drawings. In the second embodiment, the same reference numerals are assigned to members having the same functions as those illustrated in the first embodiment, and their descriptions will be omitted.

Figure 7:
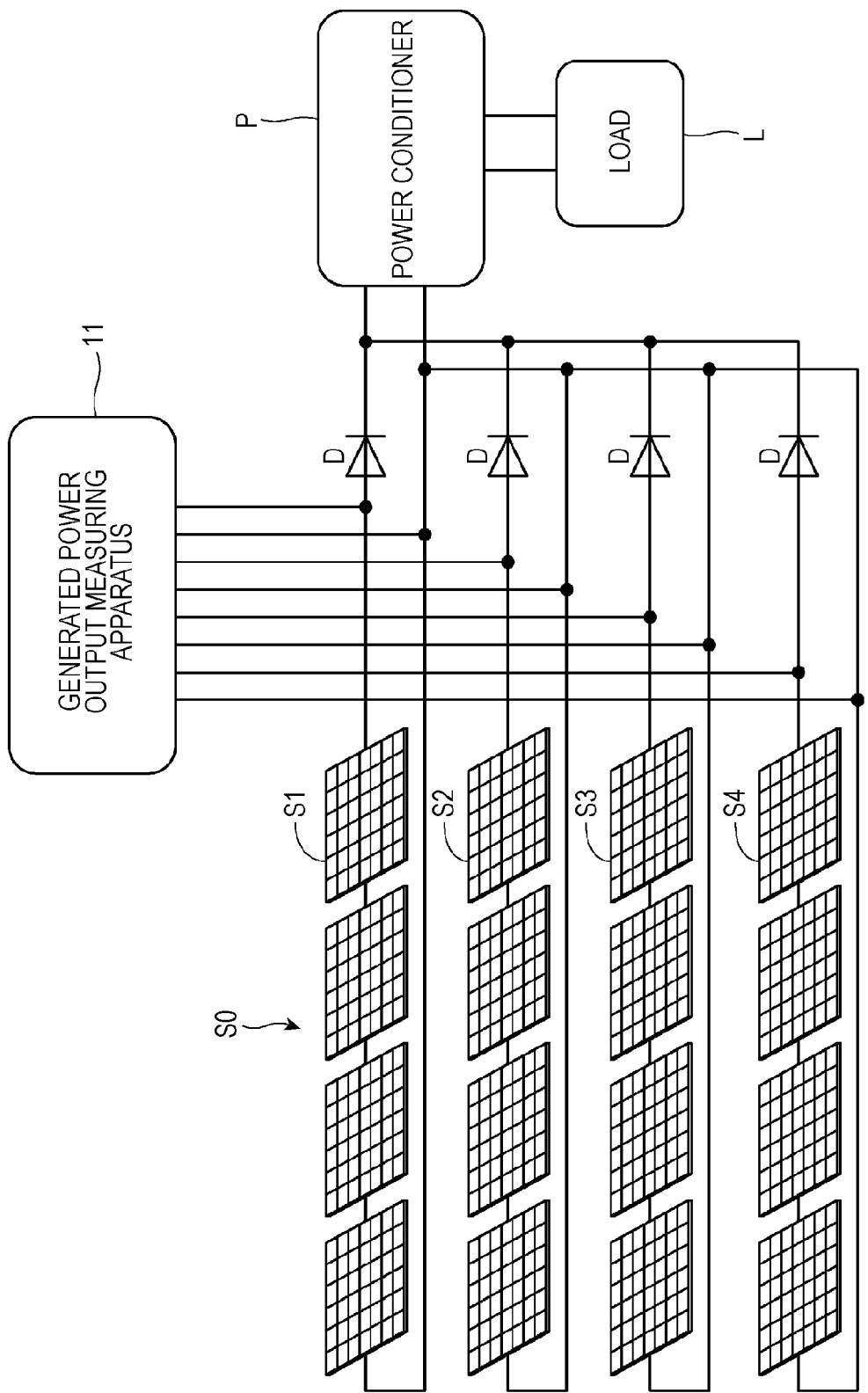
FIG. 7 is a diagram illustrating a generated power output measuring apparatus according to a second embodiment of the present disclosure, which is connected between a solar power generator and a power conditioner.

FIG. 7 illustrates a generated power output measuring apparatus 11 according to the second embodiment. The generated power output measuring apparatus 11 measures an output voltage of the solar power generator S0. The solar power generator S0 includes a plurality of parallel-connected strings S1 to S4. Each of the strings includes a plurality of solar power generation panels connected in series. The generated power output measuring apparatus 11 has a function of measuring the output of each string.

The strings S1 to S4 are respectively connected to the power conditioner P via diodes D.

Figure 8:
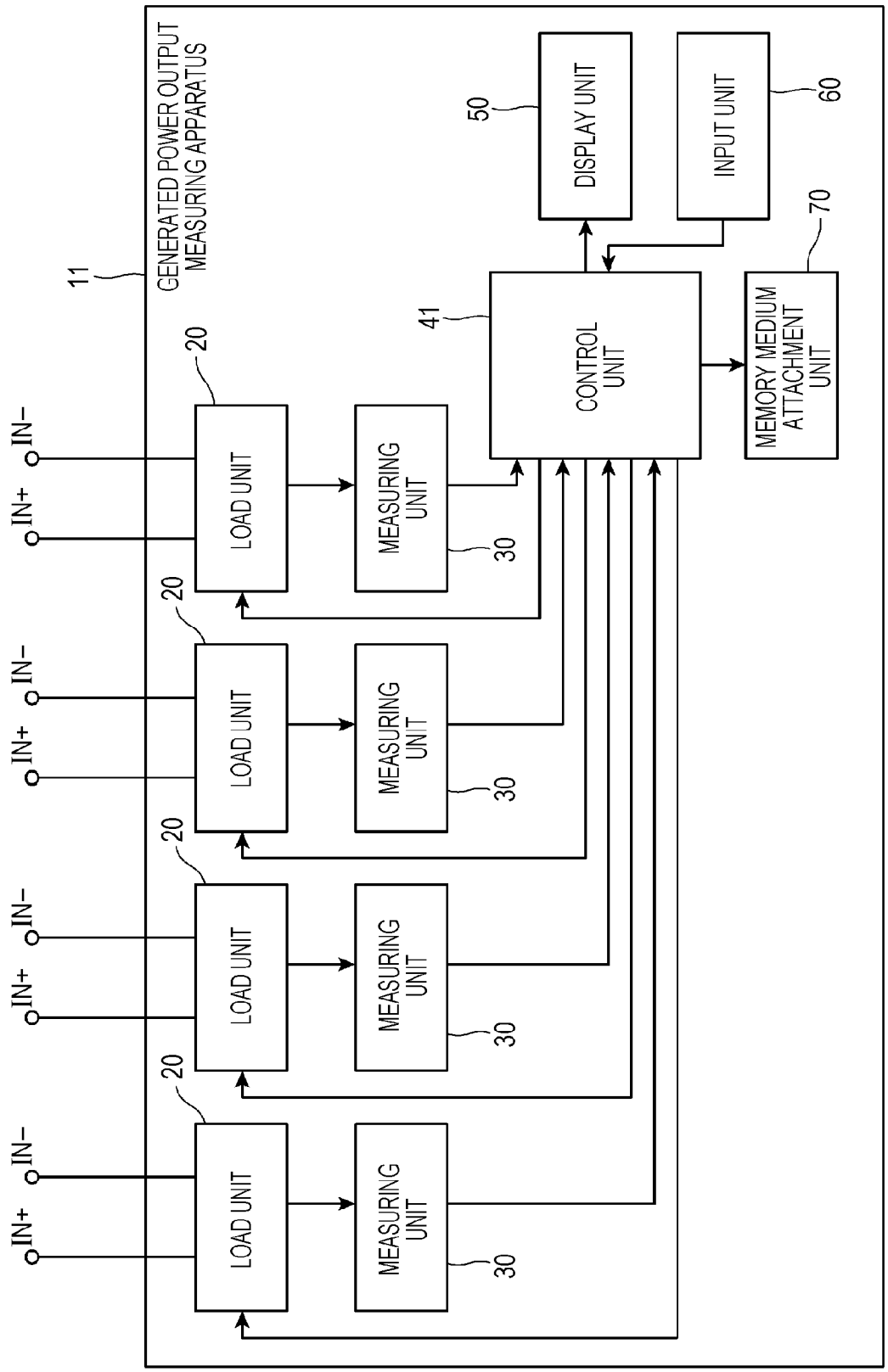
FIG. 8 is a diagram illustrating the configuration of the generated power output measuring apparatus illustrated in FIG. 7.

As illustrated in FIG. 7, the generated power output measuring apparatus 11 is connected to connecting wires between the strings S1 to S4 and the diodes D. As illustrated in FIG. 8, the load units 20 and the measuring units 30, which correspond to the strings S1 to S4, respectively, are provided in the generated power output measuring apparatus 11.

Figure 9:
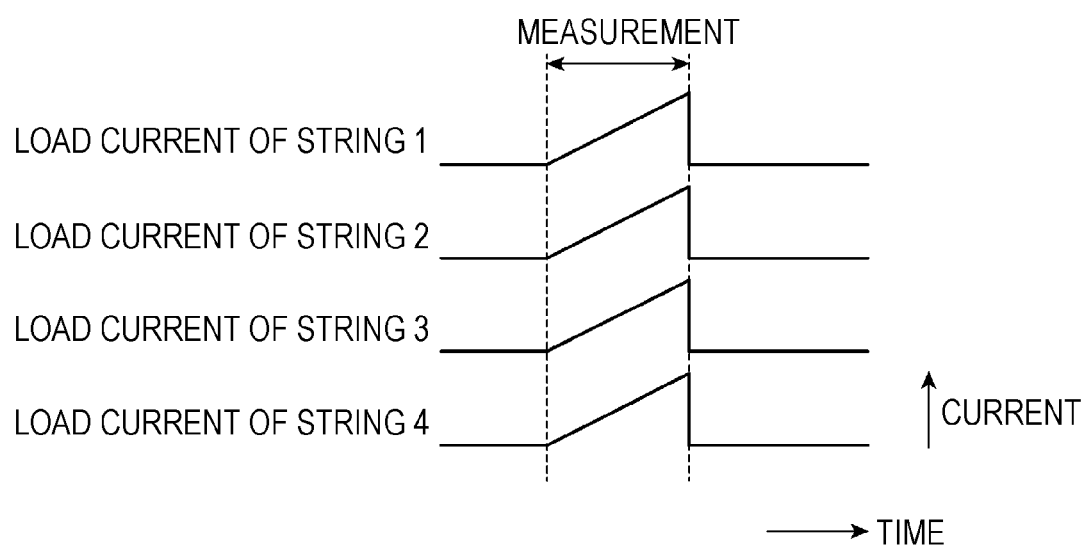
FIG. 9 is a waveform chart of currents that are simultaneously flown into a plurality of load units of the generated power output measuring apparatus illustrated in FIG. 8.

As illustrated by the waveform in FIG. 9, a control unit 41 instructs the DC power supply units 22 of the load units 20 to simultaneously flow current into all the load units 20 (adjusts the output voltages of the DC power supply units 22). Measurements by the control unit 41 can be made as in the flowchart illustrated in FIG. 4. The control unit 41 causes all the measuring units 30 to measure the voltage and current each time increasing the current. The measurement results are stored in a storage unit of the control unit 41.

In this manner, the control unit 41 instructs all the load units 20 to measure the voltages and currents of the strings S1 to S4 at one time. Consequently, the voltages and currents of the strings S1 to S4 can be measured under the same power generation environment.

Figure 10:
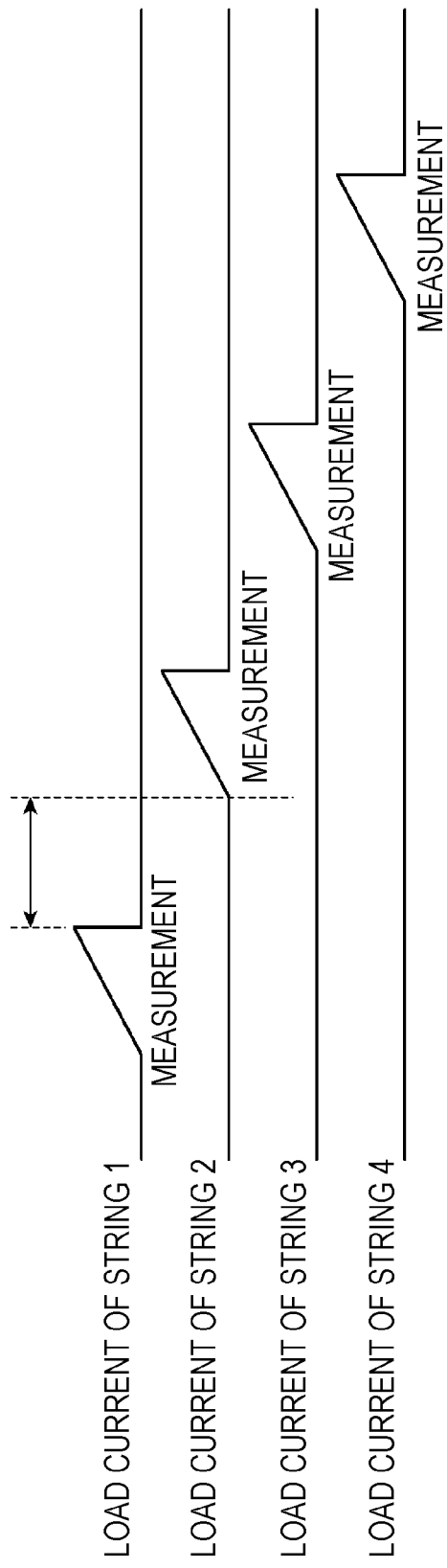
FIG. 10 is a waveform chart of currents that are sequentially flown into the plurality of load units of the generated power output measuring apparatus illustrated in FIG. 8.

Moreover, as illustrated by the waveform in FIG. 10, the control unit 41 may instruct the DC power supply units 22 of the load units 20 to sequentially flow current into the load units 20. Measurements by the control unit 41 can be made as in the flowchart illustrated in FIG. 4. The control unit 41 causes all the measuring units 30 to measure the voltage and current each time increasing the current. The measurement results are stored in the storage unit of the control unit 41.

In this manner, the control unit 41 can also measure the voltages and currents of the strings S1 to S4 sequentially. Consequently, even if a CPU of the control unit 41 does not operate at high speeds, the voltages and currents can be measured. It is preferable that the measurement intervals when the strings S1 to S4 are measured sequentially be as short as possible. The shortening of the intervals makes it possible to suppress differences in the power generation environments of the strings S1 to S4. The measurement intervals are desired to be in a range from 1 µS to 1 S, for example.

The control unit 41 displays on the display unit 50 current-voltage characteristic graphs of the strings S1 to S4 based on the data of the voltages and currents, the data being stored in the storage unit of the control unit 41.

Figure 11:
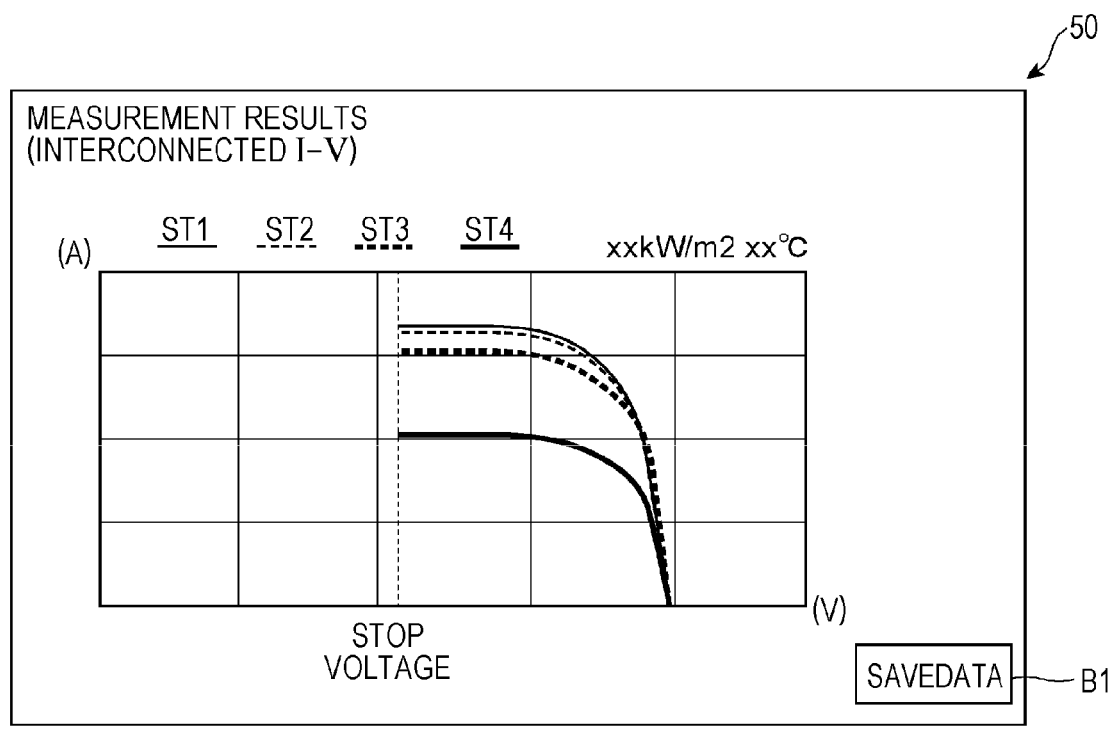
FIG. 11 is a current-voltage characteristic graph displayed on a display unit of the generated power output measuring apparatus illustrated in FIG. 8, and is a graph when a lower limit of the operating voltage of the power conditioner is set as a stop voltage.

In the display example of the display unit 50 illustrated in FIG. 11, the current drawn into the load unit 20 is increased from the interconnected string voltage $V_{ST}$ point. The control unit 41 graphs and displays the current when the output voltage of the solar power generator S is reduced. Thus, the measurer can grasp the characteristic at a glance.

Moreover, in this display example, the current-voltage characteristic graphs of the strings S1 to S4 are displayed while being superposed on top of each other. Consequently, the current-voltage characteristics of the strings S1 to S4 can be compared under the same power generation environment. Therefore, the current-voltage characteristics of the strings S1 to S4 can be comparatively evaluated. If the power generation state of a certain string is being deteriorated, it is possible to presume some failure such as "the shadow of a tree is being casted," or "the internal impedance is increasing" is occurring on the solar power generation panel of the string. Therefore, environmental measurement equipment such as a sunshine recorder is unnecessary.

Furthermore, the control unit 41 displays the current-voltage characteristic graphs on the display unit 50. Consequently, the measurer can visually determine the current-voltage characteristics. Furthermore, the control unit 41 can also automatically make a comparative determination and evaluation of the current-voltage characteristics of the strings S1 to S4 based on the measured voltages and currents of the strings S1 to S4.

For example, the control unit 41 compares currents at a predetermined voltage or voltages at a predetermined current among the strings S1 to S4 at predetermined intervals during a period of time from the start to end of the measurement. The comparison enables the control unit 41 to determine whether or not the difference between the maximum value and the minimum value is equal to or more than a threshold value, whether or not the difference between the average value and the minimum value is equal to or more than a threshold value, or whether or not the difference in the integral of the power from the start to end of the measurement is equal to or more than a threshold value.

If it is determined that these differences are equal to or more than the threshold values, the control unit 41 displays the determination results as an abnormality on the display unit 50. The control unit 41 displays the obtained numerical values (differences) to be associated with the strings. Thus, the control unit 41 can automatically measure the voltage when current is not drawn into the load unit 20 (the interconnected string voltage $V_{ST}$ or open-circuit voltage $V_{OC}$ to be described later) and a short-circuit current $I_{SC}$ that is obtained in a state where the load unit 20 is short-circuited, not at a given point but over a wide range of the voltage and/or current. Therefore, the control unit 41 can make a comparative failure/non-failure determination for the current-voltage characteristics of the strings S1 to S4 based on the measurement results.

In this manner, the generated power output measuring apparatus 11 can measure the voltages and currents of the plurality of strings of the solar power generator S0 without stopping the power conditioner P.

(Third Embodiment)

A description will be given of a generated power output measuring apparatus according to a third embodiment of the present disclosure with reference to the drawings. In the third embodiment, the same functions are assigned to members having the same functions as those illustrated in the first or second embodiment, and their descriptions will be omitted.

Figure 12:
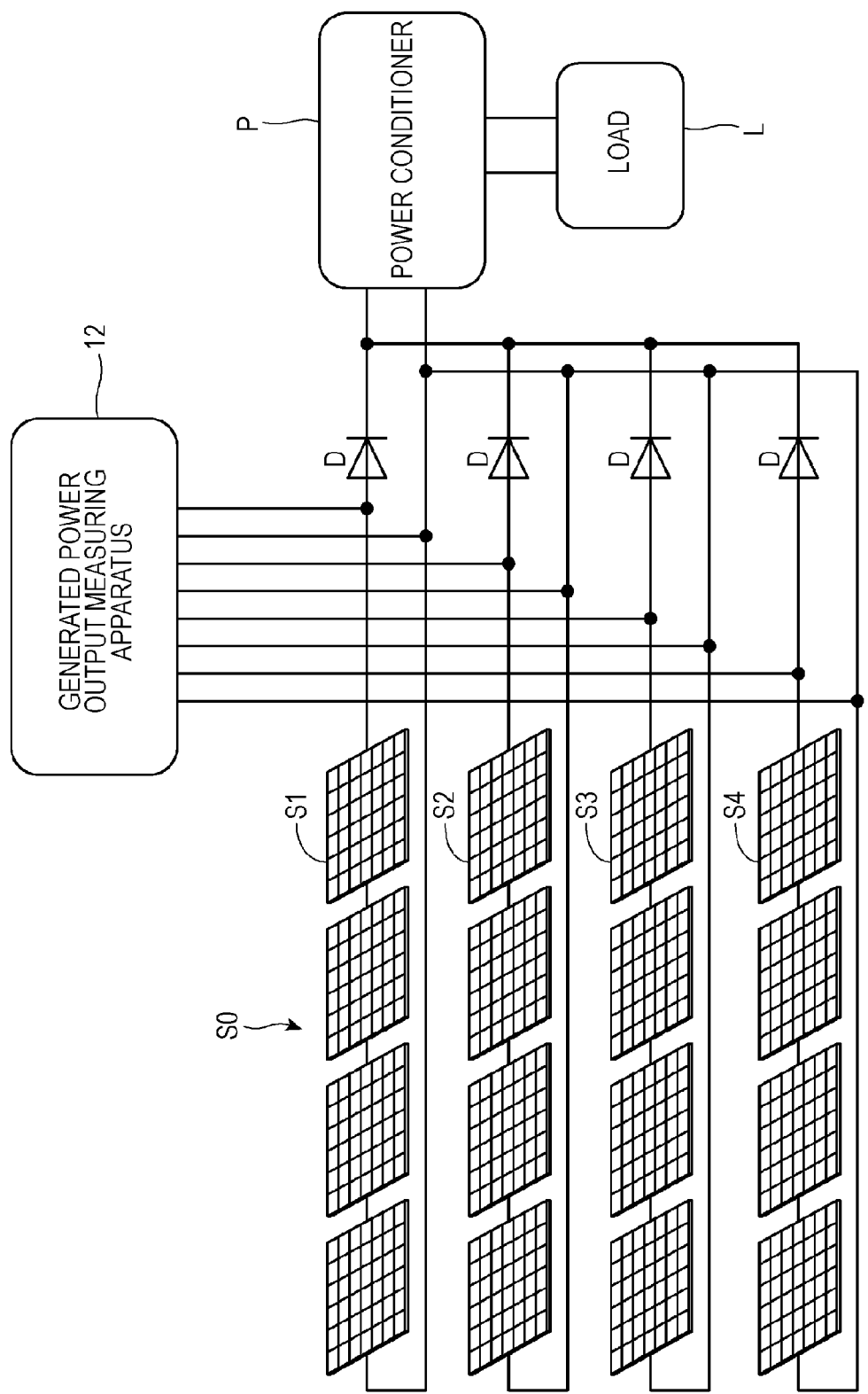
FIG. 12 is a diagram illustrating a generated power output measuring apparatus according to a third embodiment of the present disclosure, which is connected between a solar power generator and a power conditioner.
Figure 13:
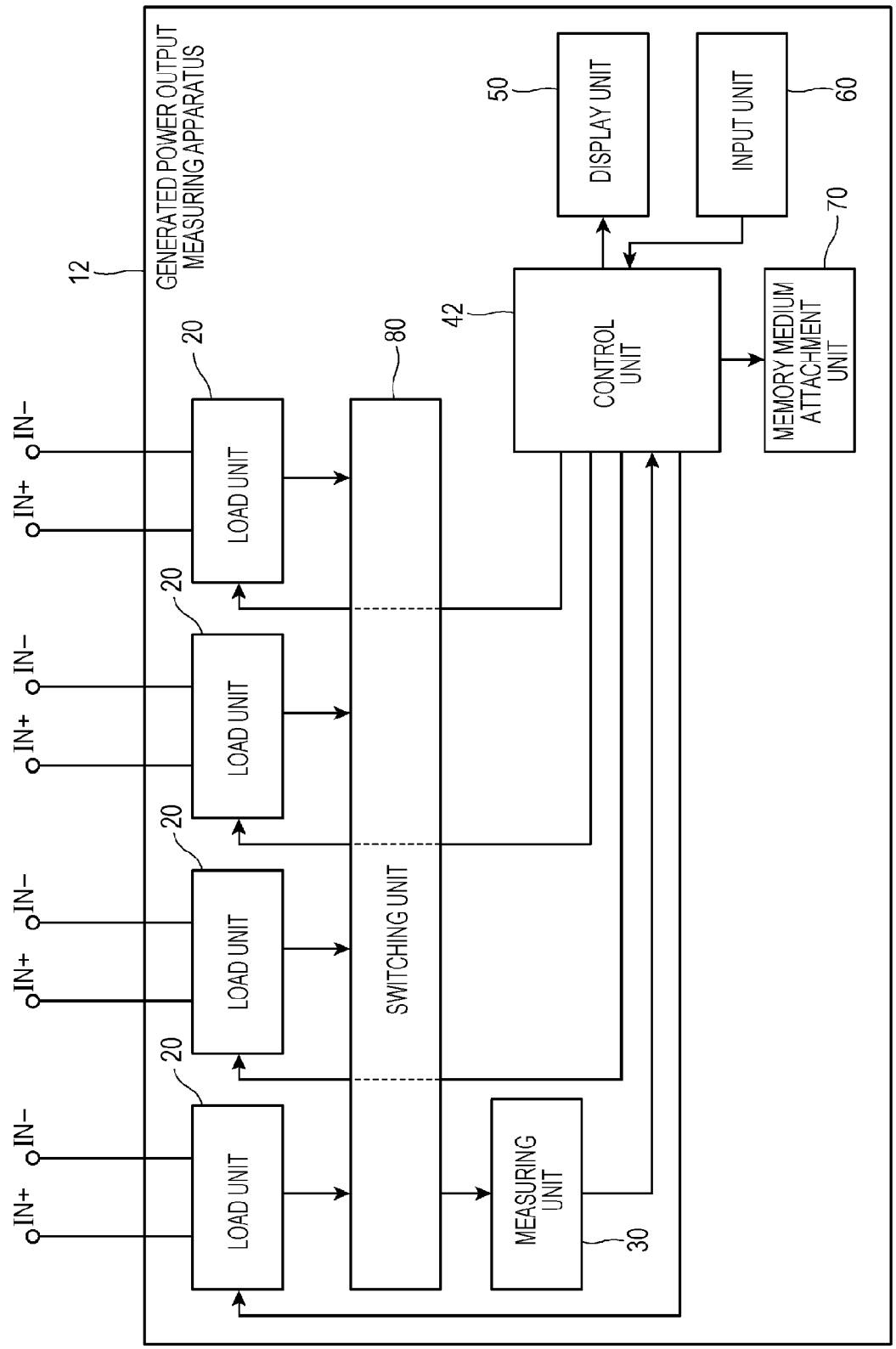
FIG. 13 is a diagram illustrating the configuration of the generated power output measuring apparatus illustrated in FIG. 12.

FIG. 12 illustrates a generated power output measuring apparatus 12 according to the third embodiment. The generated power output measuring apparatus 12 measures the output voltage of the solar power generator S0 as in the second embodiment. The generated power output measuring apparatus 12 has a function of measuring the voltages and currents of the four parallel-connected strings S1 to S4. As illustrated in FIG. 13, the generated power output measuring apparatus 12 includes the four load units 20, a switching unit (first switching unit) 80, and the measuring unit 30. The load units 20 are respectively provided for the strings S1 to S4. The switching unit 80 switches the load units 20 to be connected to the measuring unit 30. The measuring unit 30 measures the voltage and current of the load unit 20 that is being connected to the measuring unit 30 by the switching unit 80.

Figure 14:
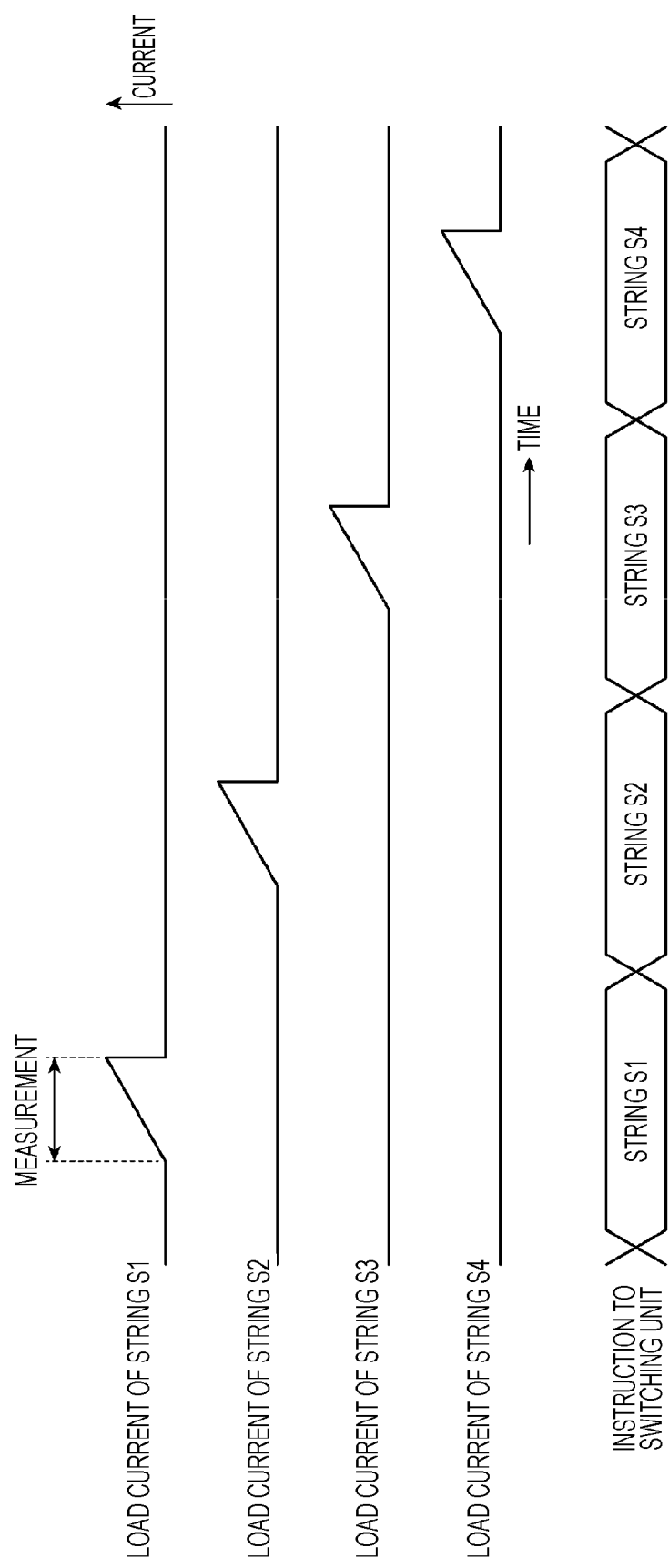
FIG. 14 is a waveform chart of currents that are sequentially flown into a plurality of load units of the generated power output measuring apparatus illustrated in FIG. 13.

As illustrated in FIG. 14, a control unit 42 controls the switching unit 80 to switch the load units 20 to be connected to the measuring unit 30. Consequently, the string to be measured is selected from the strings S1 to S4. Furthermore, the control unit 42 instructs the DC power supply units 22 of the load units 20 to sequentially flow current into the load units 20.

Measurements by the control unit 42 can be made as in the flowchart illustrated in FIG. 4. The control unit 42 causes the measuring unit 30 to measure the voltage and current of the load unit 20 that is being connected to the measuring unit 30 by the switching unit 80 (in other words, the string corresponding to this load unit 20) each time increasing the current. The control unit 42 stores the measurement result in a storage unit of the control unit 42.

The load units 20 to be connected to the measuring unit 30 are switched by the switching unit 80 and accordingly the string to be measured is selected from the strings S1 to S4.

Accordingly, there is no need to provide the measuring units 30 in accordance with the number of strings in the generated power output measuring apparatus 12. In other words, one measuring unit 30 can measure the voltages and currents of the plurality of strings S1 to S4. Moreover, the voltages and currents of the strings S1 to S4 are measured separately. Thus, even if a CPU of the control unit 42 is not one that operates at high speeds, the voltages and currents of the strings can be measured.

As illustrated in FIG. 11, the voltages and currents that have been measured in this manner can be displayed on the display unit 50 as the current-voltage characteristic graphs of the strings S1 to S4 as in the second embodiment.

(Fourth Embodiment)

A description will be given of a generated power output measuring apparatus according to a fourth embodiment of the present disclosure with reference to the drawings. In the fourth embodiment, the same reference numerals are assigned to members having the same functions as those illustrated in the first to third embodiments, and their descriptions will be omitted.

Figure 15:
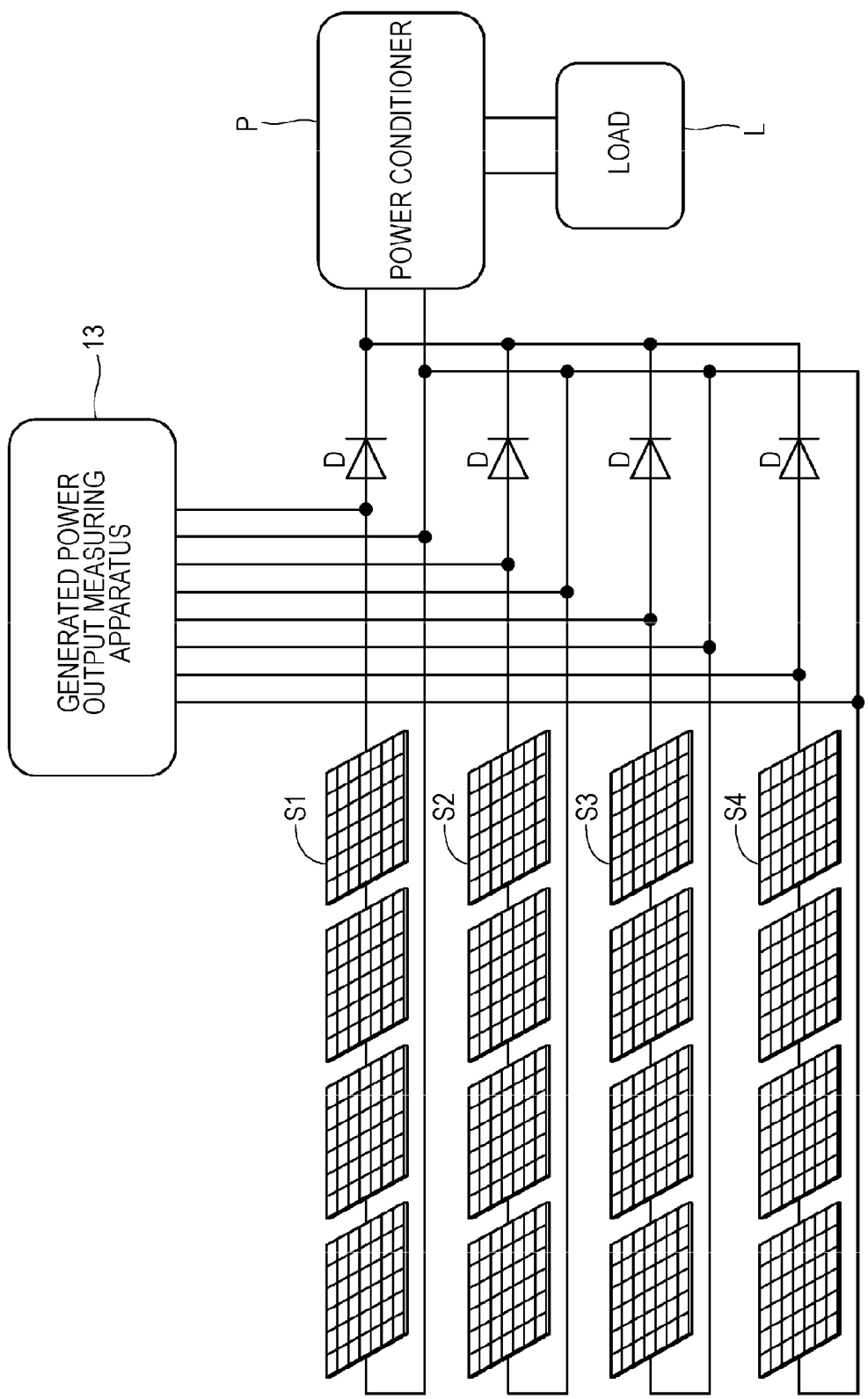
FIG. 15 is a diagram illustrating a generated power output measuring apparatus according to a fourth embodiment of the present disclosure, which is connected between a solar power generator and a power conditioner.
Figure 16:
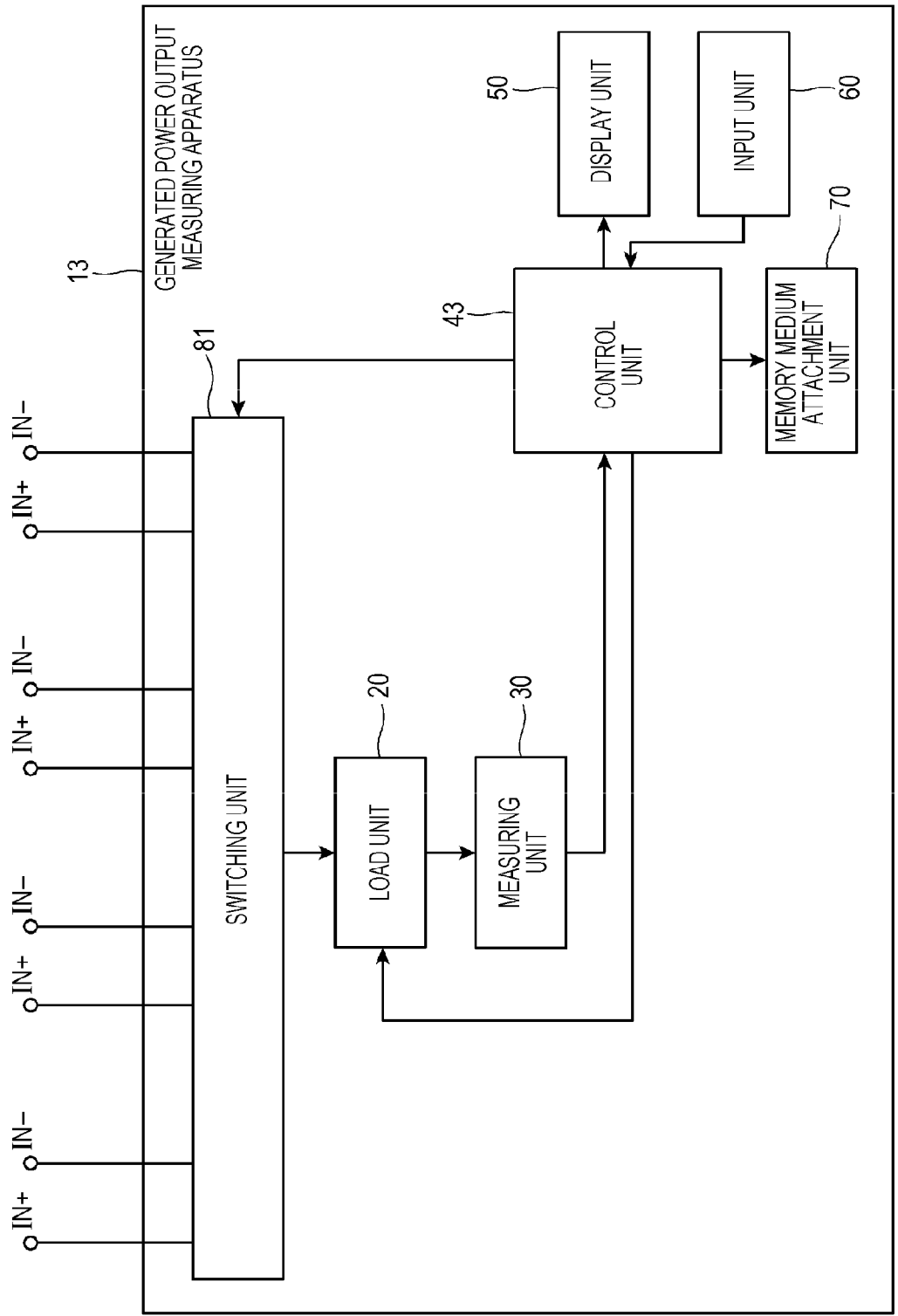
FIG. 16 is a diagram illustrating the configuration of the generated power output measuring apparatus illustrated in FIG. 15.

A generated power output measuring apparatus 13 according to the third embodiment illustrated in FIG. 15 has a function of measuring the voltages and currents of the four parallel-connected strings S1 to S4 separately, as in the second embodiment. As illustrated in FIG. 16, the generated power output measuring apparatus 12 includes a switching unit 81. The strings S1 to S4 are switched by the switching unit (second switching unit) 81 to be connected to the load unit 20.

Figure 17:
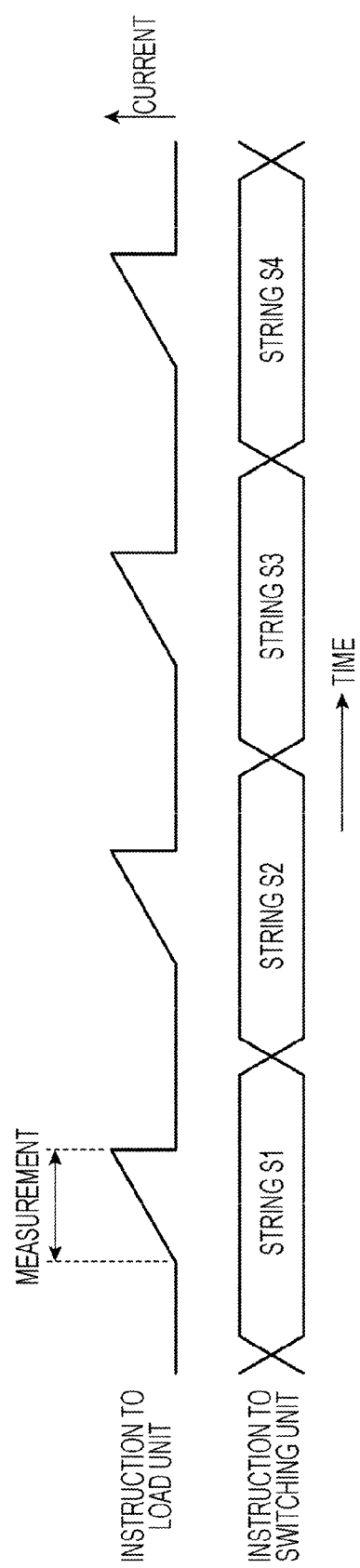
FIG. 17 is a waveform chart of currents that are sequentially flown into a plurality of load units of the generated power output measuring apparatus illustrated in FIG. 16.

As illustrated in FIG. 17, the control unit 43 controls the switching unit 81 to sequentially select the strings S1 to S4 to be connected to the load unit 20. Furthermore, the control unit 43 instructs the DC power supply unit 22 to flow current into the load unit 20 at predetermined time intervals.

Measurements by the measuring unit 30 can be made as in the flowchart illustrated in FIG. 4. The control unit 43 causes the measuring unit 30 to measure the voltage and current of one of the strings S1 to S4, the one being connected to the load unit 20 by the switching unit 81, each time increasing the current. The control unit 43 stores the measurement result in a storage unit of the control unit 43.

The strings S1 to S4 are switched by the switching unit 81 to be connected to the load unit 20 and accordingly the string to be measured is selected from the strings S1 to S4. Hence, there is no need to provide the load units 20 and the measuring units 30 in accordance with the number of strings in the generated power output measuring apparatus 13. In other words, one pair of the load unit 20 and the measuring unit 30 is used for measurement of the voltages and currents of the plurality of strings S1 to S4. Moreover, the voltages and currents of the strings S1 to S4 are measured separately. Consequently, the control unit 42 need not have a CPU that can operate at high speeds since measurement intervals are spaced in time.

As illustrated in FIG. 11, the voltages and currents that have been measured in this manner can be displayed on the display unit 50 as the current-voltage characteristic graphs of the strings S1 to S4 as in the second embodiment.

(Fifth Embodiment)

A description will be given of a generated power output measuring apparatus according to a fifth embodiment of the present disclosure with reference to the drawings. In the fifth embodiment, the same reference numerals are assigned to members having the same functions as those illustrated in the first to fourth embodiments, and their descriptions will be omitted.

Figure 18:
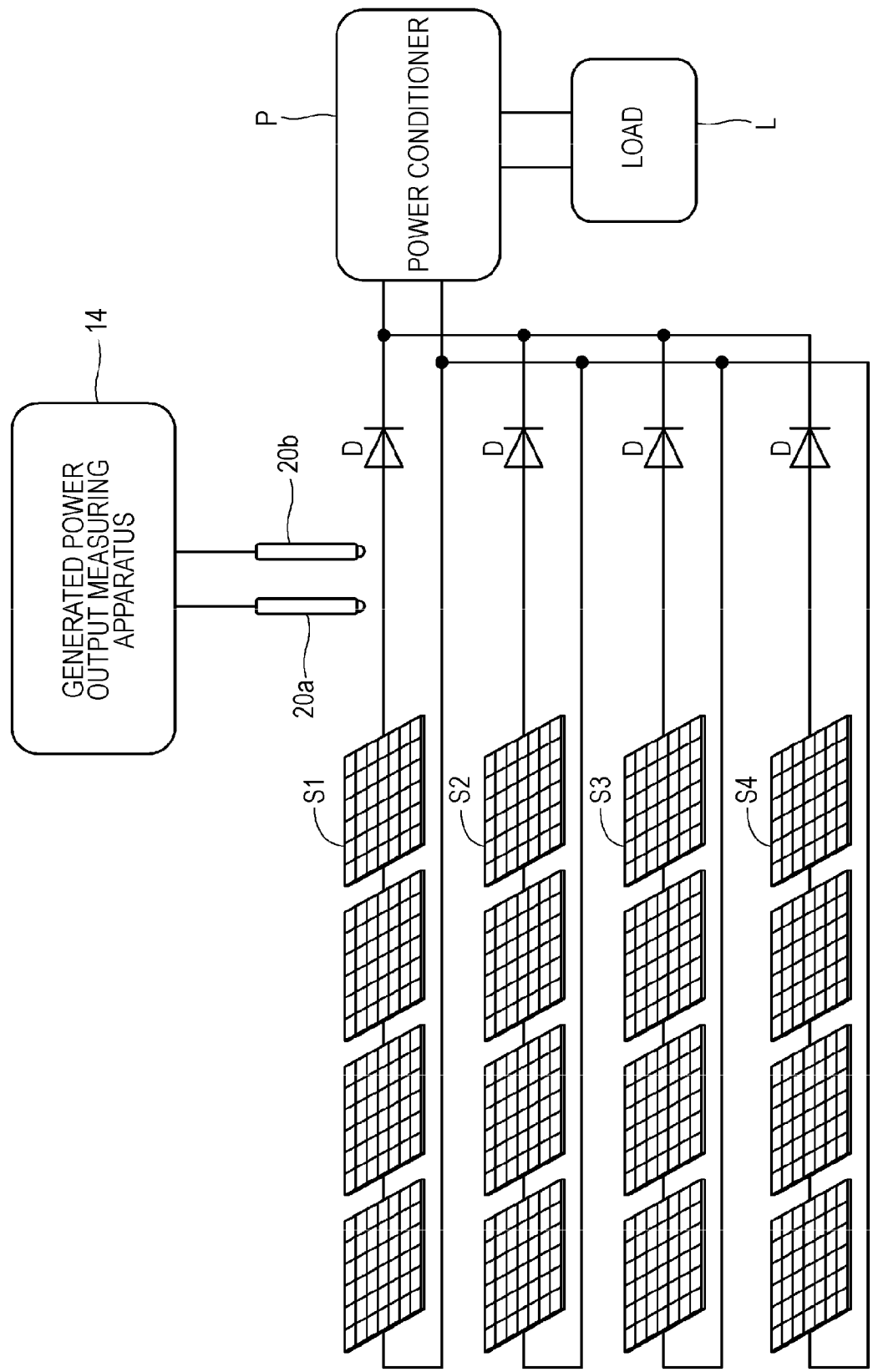
FIG. 18 is a diagram illustrating a generated power output measuring apparatus according to a fifth embodiment of the present disclosure, which is connected between a solar power generator and a power conditioner.
Figure 19:
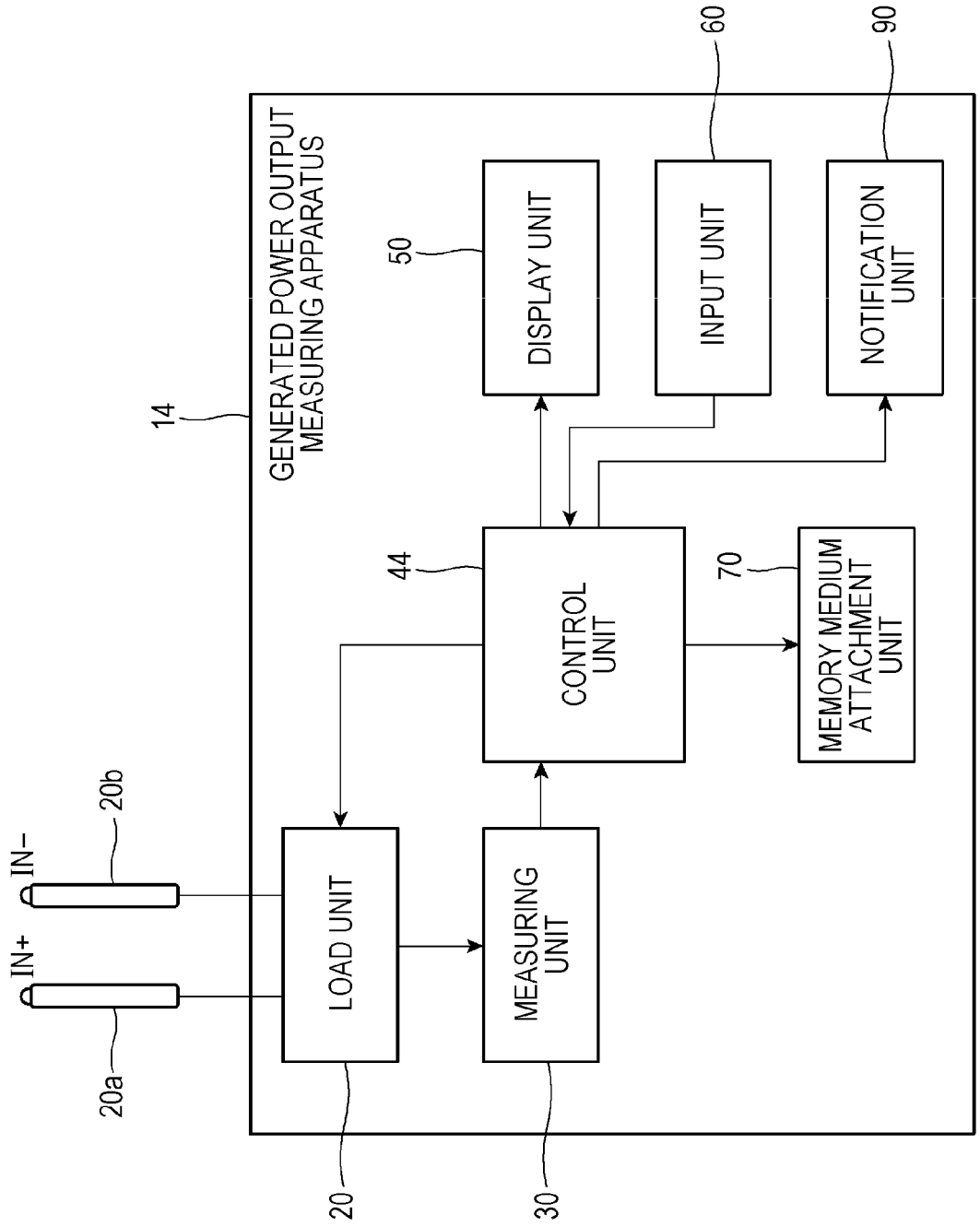
FIG. 19 is a diagram illustrating the configuration of the generated power output measuring apparatus illustrated in FIG. 18.

A generated power output measuring apparatus 14 according to the fifth embodiment illustrated in FIG. 18 has a function of measuring the four strings S1 to S4 manually. As illustrated in FIG. 19, the generated power output measuring apparatus 14 includes probes 20a and 20b, and a notification unit 90 to measure the voltages and currents of the strings S1 to S4 manually. The probe 20a is the terminal IN+ of the load unit 20. Moreover, the probe 20b is the terminal IN− of the load unit 20. The probes 20a and 20b can contact the output terminals of the strings S1 to S4. The notification unit 90 notifies an operator of the end of one measurement.

The notification unit 90 notifies the operator of completion of measurement by sounds, light, screen display, or the like. The notification unit 90 may be a buzzer. In this case, the operator holding the probes 20a and 20b with his/her hands can recognize completion of the operation even if being away from the generated power output measuring apparatus 14. If the completion of the operation is notified by light, the notification unit 90 may be an LED or rotating lamp. If the completion of the operation is notified by screen display, the notification unit 90 may be the display unit 50 or another monitor of a separate body.

Figure 20:
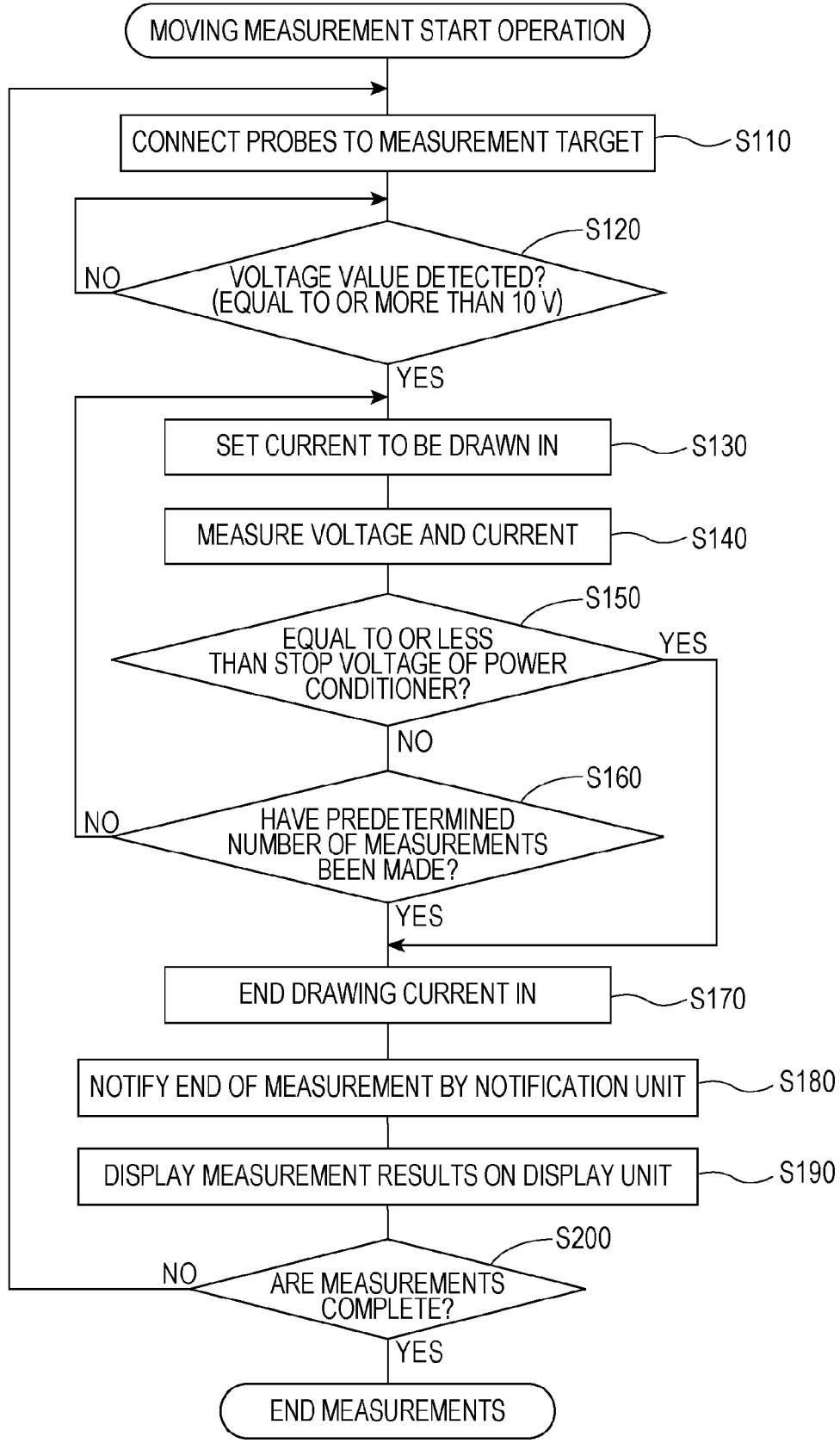
FIG. 20 is a flowchart illustrating the operation and usage state of the generated power output measuring apparatus illustrated in FIG. 19.

Here, a description will be given of the operation and usage state of the generated power output measuring apparatus 14 with reference to FIG. 20. Assume that measuring the currents and voltages of the four strings S1 to S4 is set by the input unit 60 in the generated power output measuring apparatus 14.

Firstly, the operator connects the probes 20a and 20b to one of the strings S1 to S4 which is a measurement target (Step S110). For example, the operator connects the probes 20a and 20b to the string S1. In this case, a control unit 44 measures the interconnected string voltage $V_{ST}$ of the string S1. The interconnected string voltage $V_{ST}$ is obtained by measuring the voltage across the resistor 26 in FIG. 3 by the measuring unit 30 without drawing a current into the load unit 20.

If the interconnected string voltage $V_{ST}$ is equal to or more than a predetermined voltage (e.g., 10 V), the control unit 44 judges that the probes 20a and 20b are in contact with the string S1. The control unit 44 starts measuring the voltage and current of the string S1 (Step S120). If the interconnected string voltage $V_{ST}$ is less than the predetermined voltage, the control unit 44 judges that the probes 20a and 20b are not in contact with the string S1. The control unit 44 waits for the start of measurement while repeating Step S120 until the interconnected string voltage $V_{ST}$ equal to or more than the predetermined voltage is detected.

After the start of measurement, the control unit 44 executes Steps S130 to Steps S170 as in Steps S20 to S60 in the flowchart illustrated in FIG. 4. In other words, the measuring unit 30 measures the voltage and current of the string S1 in accordance with the current flowing through the load unit 20.

When the measurement of the voltage and current of the string S1 ends, the control unit 44 causes the notification unit 90 to notify the end of the measurement of the string S1 (Step S180). The notification enables the operator to obtain a timing to remove the probes 20a and 20b from the string S1 and move them to the next string S2.

The control unit 44 displays on the display unit 50 a current-voltage characteristic graph of the string based on the data of the voltage and current of the string, the data being stored in a storage unit of the control unit 44 (Step S190). If it is after the second (next string) measurement, the control unit 44 displays two graphs while superimposing one on top of the other as in the graph illustrated in FIG. 11, for example.

The control unit 44 determines whether or not measurements of strings being preset measurement targets are complete (Step S200). If not all the strings have been measured, the control unit 44 returns to Step S110, and repeats measurements. If all the strings have been measured, the control unit 44 ends the process.

In this manner, unlike the second to fourth embodiments, in the generated power output measuring apparatus 14 according to the fifth embodiment, the string to be measured is selected to be manually measured. With the voltage across the resistor 26 measured by the measuring unit 30 being equal to or more than the predetermined voltage as an impetus, the control unit 44 increases the current flowing through the load unit 20 and causes the measuring unit 30 to measure the voltage and current of the string. Furthermore, the control unit 44 causes the notification unit 90 to notify the end of the measurement by the measuring unit 30. Hence, the plurality of strings can reliably be measured manually without stopping the power conditioner P. Moreover, the measurer can make measurements smoothly even if his/her hands are full with the probes 20a and 20b.

(Sixth Embodiment)

A description will be given of a generated power output measuring apparatus according to a sixth embodiment of the present disclosure with reference to the drawings. In the sixth embodiment, the same reference numerals are assigned to members having the same functions as those illustrated in the first to fifth embodiments, and their descriptions will be omitted.

Figure 21:
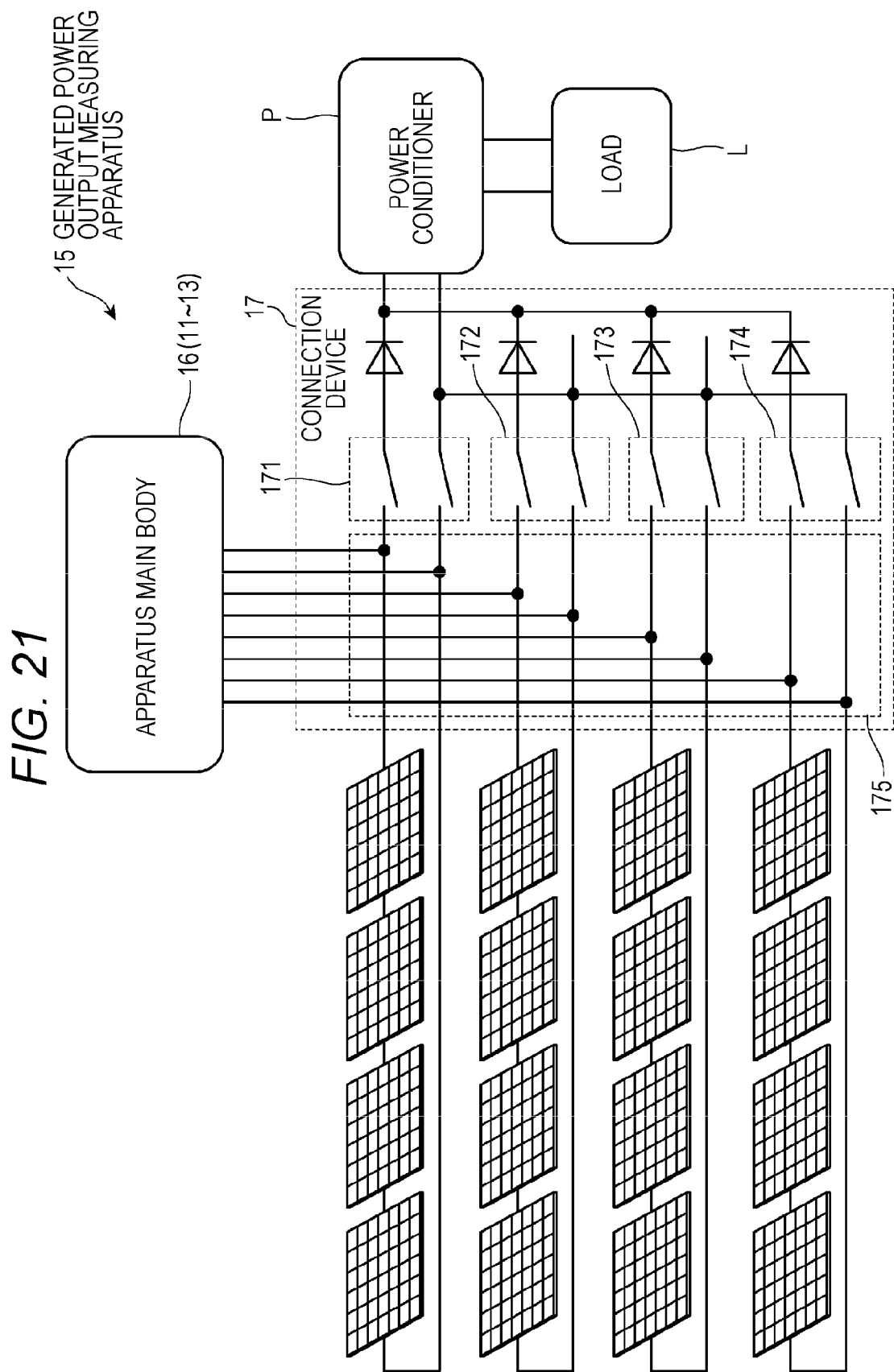
FIG. 21 is a diagram illustrating an apparatus main body of a generated power output measuring apparatus according to a sixth embodiment of the present disclosure, which is connected to a connection device placed between a solar power generator and a power conditioner.

As illustrated in FIG. 21, a generated power output measuring apparatus 15 includes an apparatus main body 16 and a connection device 17. The apparatus main body 16 corresponds to any of the generated power output measuring apparatuses 11 to 14 according to the second to fifth embodiments.

The connection device 17 includes brakers 171 to 174 and a terminal board 175. The breakers 171 to 174 are an example of a switch for switching the connection and disconnection between each string and the power conditioner P, and can detect an overcurrent. The terminal board 175 is responsible for connecting the apparatus main body 16 to the connecting wires of the strings S1 to S4.

The breakers 171 to 174 connect any one of the strings S1 to S4 with the power conditioner P. When the voltage and current of each string are measured, its corresponding breaker is disconnected. Consequently, the voltages and currents of the strings S1 to S4 can be measured. Thus, the apparatus main body 16 can measure the voltage and current of the string from a state where current is not flown into the load unit 20 to a state where the terminals IN+ and IN− are short-circuited in the load unit 20.

A description will hereinafter be given of measurement by the generated power output measuring apparatus 15 taking as an example a case where the apparatus main body 16 is the generated power output measuring apparatus 11 illustrated in FIG. 8.

Firstly, the control unit 41 recognizes, as the open-circuit voltage $V_{OC}$, the voltage between the terminals (between the terminals IN+ and IN− of each of the strings S1 to S4) when current is not flown into the load unit 20 (in the event of an open circuit). The control unit 41 causes the measuring unit 30 to measure the voltage across the resistor 26 (refer to FIG. 3) of the load unit 20.

Next, the control unit 41 gradually increases the currents flowing through the load units 20 corresponding to the strings S1 to S4 on the instruction to the DC power supply units 22. The measuring unit 30 then measures the voltage and current of the string to be measured each time increasing the current. The control unit 41 ends the measurement when between the source and drain of the FET 21 in the load unit 20 is short-circuited (in the event of a short circuit).

Figure 22:
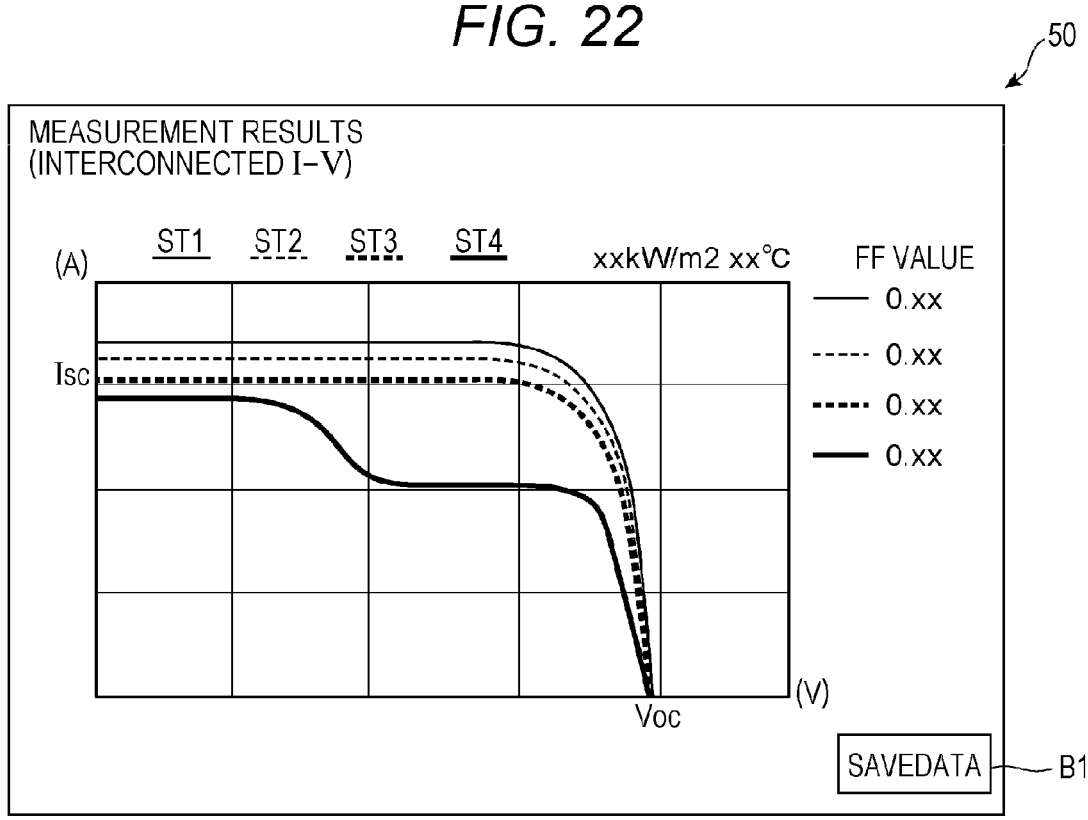
FIG. 22 is a diagram illustrating a current-voltage characteristic graph displayed on a display unit of the generated power output measuring apparatus illustrated in FIG. 19.

The control unit 41 can display a current-voltage characteristic graph on the display unit 50 based on the data of the voltage and current of each string, the data being stored in the storage unit of the control unit 41 (refer to FIG. 22).

Figure 23:
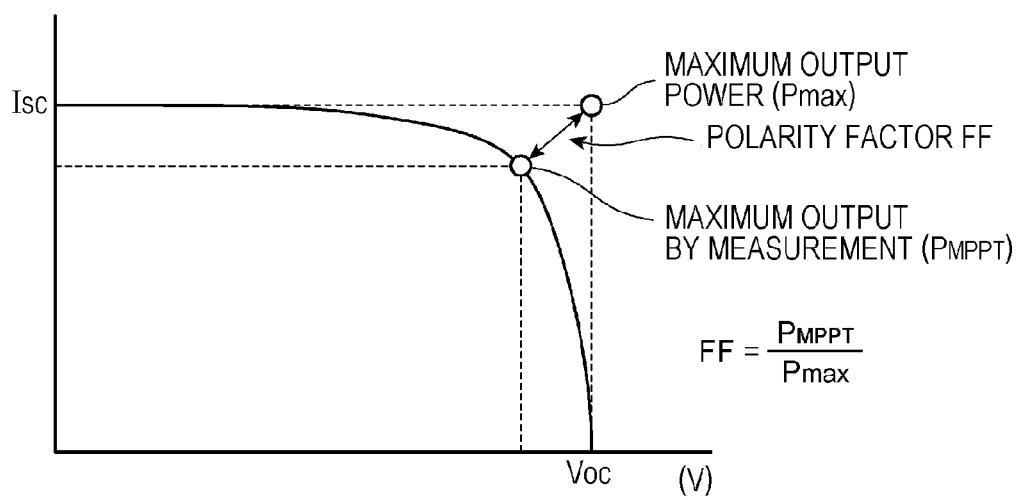
FIG. 23 is a diagram illustrating a polarity factor displayed on the display unit of the generated power output measuring apparatus illustrated in FIG. 19.

In this manner, the open-circuit voltage $V_{OC}$ and the short-circuit current $I_{SC}$ are measured. The control unit 41 can calculate the polarity factors FF of the strings S1 to S4 based on the measurement results, and display them on the display unit 50. As illustrated in FIG. 23, the polarity factor FF is obtained by dividing the maximum power $P_{MPPT}$ by the measurement result by the mathematical maximum power $P_{max}$. The maximum power $P_{max}$ is obtained by multiplying the open-circuit voltage $V_{OC}$ by the short-circuit current $I_{SC}$. In FIG. 22, the control unit 41 displays the polarity factor FF as an "FF value."

In the sixth embodiment, the open-circuit voltage $V_{OC}$ and the short-circuit current $I_{SC}$ are measured. Thus, a characteristic change in the event of an open circuit and characteristic change in the event of a short circuit of each of the strings S1 to S4 can be easily checked.

As described above, an abnormality caused by deterioration of the characteristic of the solar power generation panel can be detected from the characteristic change in the event of a short circuit.

Moreover, the characteristic change at the point of the open-circuit voltage $V_{OC}$ is considered to be caused by a brake in the solar power generation panel included in the string, and the like. In such a case, the control unit 41 can display on the display unit 50 messages such as that "a break in the solar power generator has occurred." The control unit 41 may set a plurality of threshold values to have stepwise different values. In this case, the control unit 41 may display a different message in accordance with the degree (different threshold value) of a characteristic change in the event of an open circuit. Consequently, the display unit 50 can display the degree of the failure of the solar power generator.

In the sixth embodiment, the voltages and currents of the strings S1 to S4 are measured. Thus, the apparatus main body 16 is any of the generated power output measuring apparatuses 11 to 14 according to the second to fourth embodiments. However, the solar power generator may include one solar power generation panel. Moreover, the solar power generation panel may be one string including a plurality of solar power generation panels connected in series. In these cases, the apparatus main body 16 may be the generated power output measuring apparatus 10 according to the first embodiment.

Up to this point the descriptions have been given of the generated power output measuring apparatuses according to the first to sixth embodiments of the present disclosure. In the first to sixth embodiments, the solar power generator is illustrated as an example of a power generator using natural energy. However, the power generator using natural energy may be, for example, a wind power generator.

Moreover, as in the first embodiment, the lower limit of the range of the operating voltage of the power conditioner P can be set to the stop voltage, or lower, of the power conditioner P in the second to fifth embodiments. In other words, there is also a power conditioner that can operate normally as long as the measurement time is short even if the voltage measured by the measuring unit 30 falls to 0 V. In this case, the measurement is continued until the measured voltage falls to 0 V to enable a measurement of the current that the solar power generator can flow when the output of the solar power generator is shorted (in the event of a short circuit) (the short-circuit current $I_{SC}$). The measurement of the short-circuit current $I_{SC}$ makes it possible to readily check changes in the characteristics of the strings S1 to S4 in the event of a short circuit.

Furthermore, as in the first embodiment, it may be set to flow current into the load unit 20 twice in the second to fifth embodiments. In other words, firstly, after the first flow, electric charge accumulated in the capacity included in the solar power generation panel of the solar power generator is discharged. Current is subsequently flown into the load unit 20 for the purpose of measurement and accordingly an accurate measurement is made.

Moreover, as in the second embodiment, the control unit may compare currents at a predetermined voltage and voltages or electric power at a predetermined current among the strings S1 to S4 during a period of time from the start to end of a measurement in the third to sixth embodiments. Consequently, a comparative evaluation can be made for the characteristics of the strings S1 to S4.

Furthermore, in the fifth embodiment, the control unit 44 causes the notification unit 90 to notify the operator of the end of the measurement. Similarly, the generated power output measuring apparatuses according to the first to fourth embodiments may also include the notification unit 90. The control units 40 to 43 may cause the notification unit 90 to notify the operator of the end of a measurement whenever a measurement of one string ends.

The generated power output measuring apparatus of the present disclosure can be suitably used for the maintenance of a power generator using natural energy. The generated power output measuring apparatus of the present disclosure can be suitably used especially for inspecting a solar power generator by measuring its outputs (current and/or voltage).

Moreover, the generated power output measuring apparatus 10 may be connected to the output of the solar power generator S or the input of the power conditioner P. In the first embodiment, the control unit 40 may have a function of instructing the DC power supply unit 22 on the current flowing through the load unit 20 by means of a voltage and displaying the result on the display unit 50 based on the voltage and current measured by the measuring unit 30. Moreover, in the first embodiment, with the setting of voltage by the control unit 40, the DC power supply unit 22 may output the voltage instructed by the control unit 40 to the gate of the FET 21 via the OP amplifier 23. In this case, the FET 21 flows a current in accordance with the gate voltage as the drain-source current from the terminals IN+ to IN−.

Moreover, in the first embodiment, the output voltage of the solar power generator S drops by the load unit 20 drawing a current in. If the power conditioner P stops, it influences the load L and the selling of electric power. Accordingly, it is considered to set a range of voltage where the power conditioner P can operate to a larger voltage than the stop voltage of the power conditioner P and to make a measurement only in the range of voltage larger than the stop voltage of the power conditioner P. However, for example, even if the stop voltage being the lower limit of the operating voltage of the power conditioner P falls below 100 V and the voltage falls to or below the stop voltage, the power conditioner P operates normally as long as the measurement time is short. In the generated power output measuring apparatus 10 according to the first embodiment, the control unit 40 executes one step of increasing the current for approximately 20 to 30 µS. Accordingly, even if the power conditioner P is at the stop voltage or lower, the power conditioner P does not stop by making a measurement for a short time while making a period of time during which current is flown into the load unit 20 shorter than a period of time during which the power conditioner P detects a voltage equal to or less than the stop voltage and stops. Therefore, even if the voltage measured by the measuring unit 30 has already fallen to or below the stop voltage of the power conditioner P, it does not influence the power conditioner P. Therefore, the range of voltage where the power conditioner P can operate can be set to the stop voltage or lower by making the measurement time short.

Moreover, in the first embodiment, the control unit 40 may display on the display unit 50 messages such as that "the characteristic of the solar power generator is deteriorating" when comparing the measured short-circuit current $I_{SC}$ with the threshold value of deterioration of the characteristic of the solar power generator S, the threshold value being set in the control unit 40, and finding that the measured short-circuit $I_{SC}$ is smaller than the threshold value. At this point, several kinds of threshold values may be provided stepwise such that the current value gradually becomes smaller, and the degree of deterioration of the solar power generator S may be displayed by level.

Moreover, in the display unit 50 illustrated in FIG. 11, the current drawn into the load unit 20 from the interconnected string voltage $V_{ST}$ is increased, and the current when the output voltage of the solar power generator S is reduced is graphed and displayed. Accordingly, a measurer can grasp the characteristic at a glance.

Moreover, in the third embodiment, the control unit 42 may store in the storage unit of the control unit 41 the measurement result of the voltage and current by the measuring unit 30 by associating it with a selection from the strings S1 to S4 by the switching unit 80 whenever the current increases. The selection from the strings S1 to S4 is made by the switching unit 80 switching the connections between the load units 20 and the measuring unit 30. Accordingly, there is no need to provide the measuring units 30 corresponding to the number of strings, and the measuring unit 30 can be shared. Moreover, since measurement intervals are spaced in time, even if the CPU of the control unit 42 does not operate at high speeds, the voltage and current can be measured.

Moreover, in the fourth embodiment, the control unit 43 may store in the storage unit of the control unit 41 the measurement result of the voltage and current by the measuring unit 30 by associating it with a selection from the strings S1 to S4 by the switching unit 81 whenever the current increases. The selection from the strings S1 to S4 is made by the switching unit 81 switching the connections between the strings S1 to S4 and the load unit 20. Accordingly, there is no need to provide the load units 20 and the measuring units 30 corresponding to the number of strings, and the load unit 20 and the measuring unit 30 can be shared. Moreover, since measurement intervals are spaced in time, even if the CPU of the control unit 42 does not operate at high speeds, the voltage and current can be measured.

In the sixth embodiment, the open-circuit voltage $V_{OC}$ and the short-circuit current $I_{SC}$ are measured. Accordingly, characteristic changes at the open-circuit voltage $V_{OC}$ and the short-circuit current $I_{SC}$ of the strings S1 to S4 can readily be checked. As described above, an abnormality caused by deterioration of the characteristic of the solar power generation panel can be detected from a characteristic change at the short-circuit current $I_{SC}$. Moreover, the characteristic change at the open-circuit voltage $V_{OC}$ is considered due to a break in the solar power generation panel constituting a string. Accordingly, in such a case, the control unit 41 can display on the display unit 50 messages such as that "a break in the solar power generator has occurred." At this point, several kinds of threshold values may be provided stepwise such that the current value gradually becomes smaller, and the degree of a failure of the solar power generator S may be displayed by level. In the sixth embodiment, if the solar power generator is one solar power generation panel, or the solar power generation panel is one serial-connected string, the apparatus may body 16 can be the generated power output measuring apparatus 10 according to the first embodiment.

Moreover, in the second to fifth embodiments, as in the first embodiment, the short-circuit current $I_{SC}$ can be measured when the output of the solar power generator is short-circuited not by setting the range of voltage where the power conditioner P can operate to the stop voltage of the power conditioner P but by continuing a measurement until the voltage measured by the measuring unit 30 falls to 0 V. Characteristic changes at the short-circuit currents $I_{SC}$ of the strings S1 to S4 can readily be checked by measuring the short-circuit currents $I_{SC}$.

Moreover, the generated power output measuring apparatus (the apparatus) according to an embodiment of the present disclosure is a generated power output measuring apparatus that measures the output of a power generator using natural energy, which is connected to a power conditioner that supplies electric power to a load, and includes a load unit to which current flows from the power generator, a measuring unit that measures a voltage across and a current through the load unit, and a control unit that increases the current flowing through the load unit while the voltage measured by the measuring unit is within a range of voltage where the power conditioner can operate, and causes the measuring unit to measure the voltage and current.

According to the apparatus, even if the current from the power generator is drawn into the load unit, the control unit increases the current flowing through the load unit only while the voltage is being within the range of voltage where the power conditioner can operate. Accordingly, a measurement of the power generator can be made by the measuring unit without stopping the power conditioner.

It is desired for the control unit to set a period of time to flow current through the load unit to be less than a period of time during which the power conditioner detects the voltage equal to or less than the stop voltage and stops. Because the control unit controls the current flowing through the load unit in this manner, the voltage and current can be measured until falling to the voltage being equal to or less than the stop voltage of the power conditioner.

It is desirable that the load unit and the measuring unit be provided corresponding to each of the power generators in parallel, and that the control unit simultaneously instruct flowing current into the plurality of load units and cause the plurality of measuring units to simultaneously measure the voltages and currents.

When the parallel-connected power generators are measured by the plurality of load units and measuring units, the control unit simultaneously instructs flowing current into the load units and causes the plurality of measuring units to simultaneously measure the voltages and currents. Accordingly, the parallel-connected power generators can be measured under the same condition.

It is desirable that the load unit be provided corresponding to each of the power generators in parallel, that the plurality of load units be connected to a switching unit that switches connections with the measuring unit, and that the control unit cause the switching unit to sequentially select the connections between the load units and the measuring unit and cause the measuring unit to sequentially measure the voltages and currents.

The control unit causes the measuring unit to sequentially measure the voltages and currents while causing the switching unit to switch the connections between the plurality of load units and the measuring unit. Accordingly, it is not necessary to provide the measuring units corresponding to the power generators. Moreover, the control unit makes measurements while causing the switching unit to sequentially switch. Accordingly, it is not necessary for the control unit to operate at high speeds, and thus a low-speed one can be used for the control unit.

It is desirable that the load unit be connected to a switching unit that switches the outputs of the parallel-connected power generators, and that the control unit cause the switching unit to sequentially select the connections between the outputs from the plurality of power generators and the load unit, and cause the measuring unit to sequentially measure the voltages and currents.

The control unit causes the load unit and the measuring unit to sequentially measure the voltages and currents while causing the switching unit to switch the outputs of the parallel-connected power generators. Accordingly, it is not necessary to provide the load units and the measuring units corresponding to the power generators. Moreover, the control unit makes measurements while causing the switching unit to sequentially switch. Accordingly, it is not necessary for the control unit to operate at high speeds, and thus a low-speed one can be used for the control unit.

It is desirable that, with the voltage measured by the measuring unit being equal to or more than a predetermined voltage as an impetus, the control unit increase the current flowing through the load unit, cause the measuring unit to measure the voltage and current, and cause a notification unit to notify that the measurement by the measuring unit has ended.

When power generator the output of the power generator is manually brought into contact in measurement, the load unit needs to be securely connected to the power generator. The measurement in a secure contact state can be started by the control unit increasing the current flowing through the load unit and starting the measurement with the voltage measured by the measuring unit being equal to or more than the predetermined voltage as an impetus. Moreover, the end of the measurement can be recognized since the control unit causes the notification unit to notify that the measurement by the measuring unit has ended.

The control unit reads in the voltages and currents measured by the measuring unit and displays on the display unit graphs illustrating the relationships between the voltages and the currents to be associated with the plurality of power generators while superimposing them on top of each other. Accordingly, the measurement results under the same power generation environment can be compared, and thus a comparative evaluation is possible. Therefore, measurement equipment that measures natural environment is unnecessary for the purpose of evaluating the power generation of the power generator.

If a connection device that switches a connection and a disconnection is provided between the power conditioner and the power generator, the characteristics of the voltage and current can be measured in a state where the power generator and the power conditioner are disconnected. Accordingly, an open-circuit voltage and a short-circuit current can be measured.

If the control unit compares currents at a predetermined voltage, voltages or electric power at a predetermined current from the start to end of a measurement among the parallel-connected power generators and makes a comparative failure/non-failure determination, a wide range of determinations can be made automatically.

The apparatus can make a measurement of the power generator by the measuring unit without stopping the power conditioner. Accordingly, it is possible to suppress loss in power generation of the power generator due to the measurement of the output of the power generator.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A generated power output measuring apparatus comprising:
    a load unit connected to a connecting wire between a power generator using natural energy and a power conditioner configured to supply electric power of the power generator to an external load, the load unit being configured to draw a current from the power generator;
    a measuring unit configured to measure a voltage and current of the power generator via the load unit; and
    a control unit configured to increase the current flowing through the load unit and cause the measuring unit to measure the voltage and current of the power generator without stopping the power conditioner while the voltage measured by the measuring unit is in a range of operating voltage of the power conditioner,
    wherein the control unit is configured to set a period of time during which the current is flown into the load unit after an input voltage into the power conditioner falls to a stop voltage of the power conditioner shorter than a period of time between when the input voltage into the power conditioner falls to or below the stop voltage of the power conditioner and when the power conditioner stops.

2. The generated power output measuring apparatus according to claim 1, wherein
    the power generator includes a plurality of power generating members connected in parallel, and
    the load units and the measuring units are provided respectively corresponding to the power generating members.

3. The generated power output measuring apparatus according to claim 2, wherein the control unit causes the plurality of measuring units respectively corresponding to the power generating members to substantially simultaneously measure the voltages and currents of the power generating members respectively corresponding to the measuring units.

4. The generated power output measuring apparatus according to claim 1, further comprising a first switching unit configured to switch the load units to be connected to the measuring unit, wherein
    the power generator includes a plurality of power generating members connected in parallel,
    the load units are provided respectively corresponding to the power generating members, and
    the control unit controls the first switching unit to sequentially select the load units to be connected to the measuring unit.

5. The generated power output measuring apparatus according to claim 1, further comprising a second switching unit configured to switch a plurality of power generating members to be connected to the load unit, wherein
    the power generator includes the plurality of power generating members power generator connected in parallel, and
    the control unit controls the second switching unit to sequentially select the power generating members to be connected to the load unit.

6. The generated power output measuring apparatus according to claim 1, wherein the control unit increases the current flowing through the load unit and causes the measuring unit to make the measurement when the voltage across the load unit measured by the measuring unit is equal to or more than a predetermined voltage.

7. The generated power output measuring apparatus according to claim 1, further comprising a notification unit for notifying an end of the measurement by the measuring unit upon the end of the measurement.

8. The generated power output measuring apparatus according to claim 1, wherein
    the power generator includes a plurality of power generating members connected in parallel,
    the measuring unit is set to measure the voltages and currents of the plurality of power generating members, and
    the control unit displays on a display unit graphs illustrating relationships between the voltages and currents of the plurality of power generating members while superimposing the graphs on top of each other.

9. The generated power output measuring apparatus according to claim 1, further comprising a connection device configured to switch a connection or disconnection between the power conditioner and the power generator.

10. The generated power output measuring apparatus according to claim 1, wherein
    the power generator includes a plurality of power generating members connected in parallel,
    the measuring unit is set to measure the voltages and currents of the plurality of power generating members, and
    the control unit comparatively determines a failure or non-failure for the power generating members based on measurement results related to the plurality of power generating members.

* * * * *